US010726920B2

(12) United States Patent
Yang

(10) Patent No.: US 10,726,920 B2
(45) Date of Patent: Jul. 28, 2020

(54) PRE-CHARGE VOLTAGE FOR INHIBITING UNSELECTED NAND MEMORY CELL PROGRAMMING

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/200,007

(22) Filed: Nov. 26, 2018

(65) Prior Publication Data
US 2020/0168276 A1    May 28, 2020

(51) Int. Cl.
| | |
|---|---|
| *G11C 16/04* | (2006.01) |
| *G11C 16/34* | (2006.01) |
| *G11C 16/10* | (2006.01) |
| *G11C 16/12* | (2006.01) |
| *G11C 11/34* | (2006.01) |
| *G11C 7/12* | (2006.01) |

(52) U.S. Cl.
CPC ........ *G11C 16/0433* (2013.01); *G11C 16/045* (2013.01); *G11C 16/0466* (2013.01); *G11C 16/107* (2013.01); *G11C 16/12* (2013.01); *G11C 16/3459* (2013.01); *G11C 7/12* (2013.01); *G11C 11/34* (2013.01)

(58) Field of Classification Search
CPC .............. G11C 16/0433; G11C 16/045; G11C 16/0466; G11C 16/12; G11C 16/107; G11C 16/3459
See application file for complete search history.

(56) References Cited

U.S. PATENT DOCUMENTS

| | | | |
|---|---|---|---|
| 6,859,397 | B2 | 2/2005 | Lutze et al. |
| 7,355,889 | B2 | 4/2008 | Hemink |
| 7,433,241 | B2 | 10/2008 | Dong et al. |
| 7,436,709 | B2 | 10/2008 | Higashitani |
| 7,440,323 | B2 | 10/2008 | Lutze |
| 7,460,404 | B1 | 12/2008 | Dong |

(Continued)

OTHER PUBLICATIONS

U.S. Appl. No. 15/678,683, filed Aug. 16, 2017 by Chen et al.
U.S. Appl. No. 15/726,686, filed Oct. 6, 2017 by Yu et al.
U.S. Appl. No. 16/002,825, filed Jun. 7, 2018 by Zhao et al.

*Primary Examiner* — Harry W Byrne
*Assistant Examiner* — Sultana Begum
(74) *Attorney, Agent, or Firm* — Vierra Magen Marcus LLP

(57) ABSTRACT

Techniques are provided for pre-charging NAND strings during a programming operation. The NAND strings are in a block that is divided into vertical sub-blocks. During a pre-charge phase of a programming operation, an overdrive voltage is applied to some memory cells and a bypass voltage is applied to other memory cells. The overdrive voltage allows the channel of an unselected NAND string to adequately charge during the pre-charge phase. Adequate charging of the channel helps the channel voltage to boost to a sufficient level to inhibit programming of an unselected memory cell during a program phase. Thus, program disturb is prevented, or at least reduced. The technique allows, for example, programming of memory cells in a middle vertical sub-block without causing program disturb of memory cells that are not to receive programming.

20 Claims, 23 Drawing Sheets

(56) References Cited

U.S. PATENT DOCUMENTS

| | | |
|---|---|---|
| 7,463,531 B2 | 12/2008 | Hemink |
| 7,623,386 B2 | 11/2009 | Dong |
| 7,852,675 B2 | 12/2010 | Maejima |
| 8,537,617 B2 | 9/2013 | Kim |
| 8,670,285 B2 | 3/2014 | Dong |
| 8,913,431 B1 | 12/2014 | Costa et al. |
| 9,093,157 B2 | 7/2015 | Kwak |
| 9,171,632 B2 | 10/2015 | Dong |
| 9,286,987 B1 | 3/2016 | Dong |
| 9,286,994 B1 | 3/2016 | Chen |
| 9,336,892 B1 | 5/2016 | Chen |
| 9,361,993 B1 | 6/2016 | Chen |
| 9,406,391 B1 | 8/2016 | Chen |
| 9,412,463 B1 | 8/2016 | Chen |
| 9,466,369 B1 | 10/2016 | Pang |
| 9,530,506 B2 | 12/2016 | Rabkin |
| 9,640,273 B1 | 5/2017 | Chen |
| 9,640,278 B1 | 5/2017 | Xi |
| 9,691,781 B1 | 6/2017 | Nishikawa |
| 9,704,588 B1 | 7/2017 | Ray |
| 9,747,992 B1 | 8/2017 | Chen |
| 9,761,320 B1 | 9/2017 | Chen |
| 9,887,002 B1 | 2/2018 | Zhang |
| 9,905,305 B2 | 2/2018 | Chen |
| 9,922,705 B1 | 3/2018 | Diep et al. |
| 10,008,271 B1 | 6/2018 | Diep et al. |
| 10,026,487 B2 | 7/2018 | Chen et al. |
| 2008/0062762 A1* | 3/2008 | Doyle ............... G11C 11/5642 365/185.11 |
| 2008/0186776 A1 | 8/2008 | Kim et al. |
| 2009/0180330 A1* | 7/2009 | VanBuskirk ....... G11C 16/0483 365/185.24 |
| 2011/0267913 A1* | 11/2011 | Chung ..................... G11C 7/12 365/203 |
| 2013/0182505 A1* | 7/2013 | Liu ....................... G11C 16/10 365/185.17 |
| 2013/0242667 A1 | 9/2013 | Shim |
| 2014/0043915 A1 | 2/2014 | Choi |
| 2014/0247664 A1 | 9/2014 | Hosono et al. |
| 2015/0003150 A1 | 1/2015 | Aritome |
| 2015/0036430 A1 | 2/2015 | Sukegawa et al. |
| 2015/0340093 A1* | 11/2015 | Lee ................... G11C 16/0483 365/185.05 |
| 2016/0148691 A1 | 5/2016 | Rabkin |
| 2016/0180945 A1 | 6/2016 | Ng et al. |
| 2017/0178736 A1 | 6/2017 | Yang et al. |
| 2017/0352430 A1 | 12/2017 | Chen |

* cited by examiner

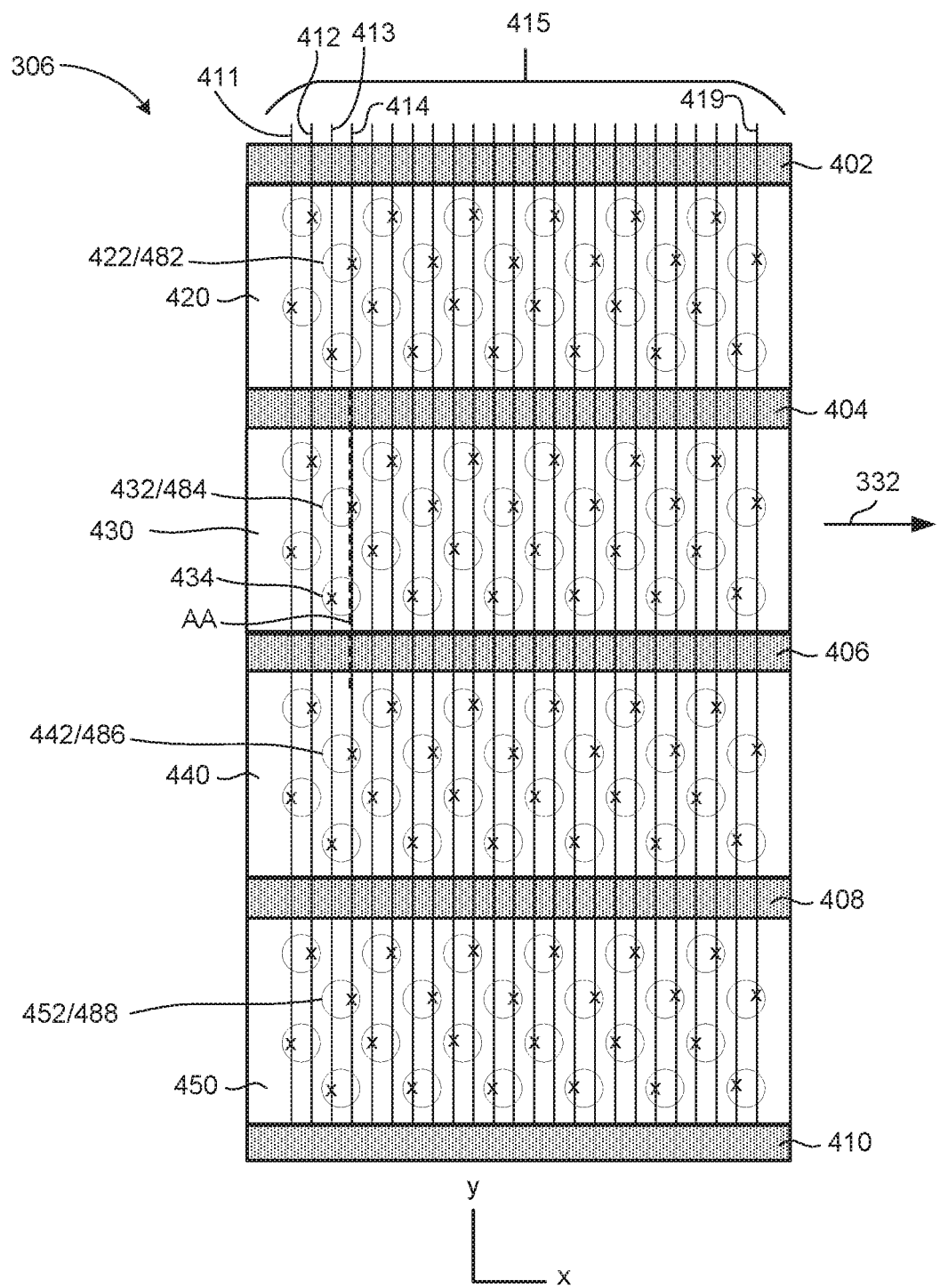

|  | 811↓ | 815↓ | 817↓ | 819↓ |
|---|---|---|---|---|
| Vprecgh | BL | | | |
| Vsg | SGD0 | SGD1 | SGD2 | SGD3 |
| Vpre_dmy | DWLd | DWLd | DWLd | DWLd |
| Vbypass | WL17 | WL17 | WL17 | WL17 |
| Vbypass | WL16 | WL16 | WL16 | WL16 |
| Vbypass | WL15 | WL15 | WL15 | WL15 |
| Vpre_OD | WL14 | WL14 | WL14 | WL14 |
| Vpre_OD | WL13 | WL13 | WL13 | WL13 |
| Vpre_OD | WL12 | WL12 | WL12 | WL12 |
| Vpre_dmy | DWL2 | DWL2 | DWL2 | DWL2 |
| Vbypass | WL11 | WL11 | WL11 | WL11 |
| Vbypass | WL10 | WL10 | WL10 | WL10 |
| Vbypass | WL9 | WL9 | WL9 | WL9 |
| Vbypass | WL8 | WL8 | WL8 | WL8 |
| Vbypass | WL7 | WL7 | WL7 | WL7 |
| Vbypass | WL6 | WL6 | WL6 | WL6 |
| Vpre_dmy | DWL1 | DWL1 | DWL1 | DWL1 |
| Vbypass | WL5 | WL5 | WL5 | WL5 |
| Vbypass | WL4 | WL4 | WL4 | WL4 |
| Vbypass | WL3 | WL3 | WL3 | WL3 |
| Vbypass | WL2 | WL2 | WL2 | WL2 |
| Vbypass | WL1 | WL1 | WL1 | WL1 |
| Vbypass | WL0 | WL0 | WL0 | WL0 |
| Vpre_dmy | DWLs | DWLs | DWLs | DWLs |
| Vss | SGS1 | SGS2 | SGS3 | SGS4 |
| Vcsrc | SL | | | |

VSB2 (WL12–WL17 region), VSB1 (WL6–WL11 region), VSB0 (WL0–WL5 region)

FIG. 8C

| | 811↘ | 815↘ | 817↘ | 819↘ | |
|---|---|---|---|---|---|
| Vss | BL | | | | |
| Vsg | SGD0 | SGD1 | SGD2 | SGD3 | |
| Vpre_dmy | DWLd | DWLd | DWLd | DWLd | |
| Vbypass | WL17 | WL17 | WL17 | WL17 | ⎫ |
| Vbypass | WL16 | WL16 | WL16 | WL16 | |
| Vbypass | WL15 | WL15 | WL15 | WL15 | ⎬ VSB2 |
| Vbypass | WL14 | WL14 | WL14 | WL14 | |
| Vbypass | WL13 | WL13 | WL13 | WL13 | |
| Vbypass | WL12 | WL12 | WL12 | WL12 | ⎭ |
| Vpre_dmy | DWL | DWL | DWL | DWL | |
| Vbypass | WL11 | WL11 | WL11 | WL11 | ⎫ |
| Vbypass | WL10 | WL10 | WL10 | WL10 | |
| Vbypass | WL9 | WL9 | WL9 | WL9 | ⎬ VSB1 |
| Vbypass | WL8 | WL8 | WL8 | WL8 | |
| Vbypass | WL7 | WL7 | WL7 | WL7 | |
| Vbypass | WL6 | WL6 | WL6 | WL6 | ⎭ |
| Vpre_dmy | DWL | DWL | DWL | DWL | |
| Vbypass | WL5 | WL5 | WL5 | WL5 | ⎫ |
| Vbypass | WL4 | WL4 | WL4 | WL4 | |
| Vpre_OD | WL3 | WL3 | WL3 | WL3 | ⎬ VSB0 |
| Vpre_OD | WL2 | WL2 | WL2 | WL2 | |
| Vpre_OD | WL1 | WL1 | WL1 | WL1 | |
| Vpre_OD | WL0 | WL0 | WL0 | WL0 | ⎭ |
| Vpre_dmy | DWLs | DWLs | DWLs | DWLs | |
| Vsg | SGS0 | SGS1 | SGS2 | SGS3 | |
| Vprecgh | SL | | | | |

PRE-CHARGE VOLTAGE FOR INHIBITING UNSELECTED NAND MEMORY CELL PROGRAMMING

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIG. 4B depicts a top view of a portion of a block of memory cells.

FIG. 8C is a block diagram to illustrate one embodiment of pre-charging the channels of unselected NAND strings from the bit line.

FIG. 9C is a block diagram to illustrate one embodiment of pre-charging the channels of unselected NAND strings from a source line.

FIG. 10C is a block diagram to illustrate one embodiment of pre-charging the channels of unselected NAND strings from both a bit line and a source line.

DETAILED DESCRIPTION

Figure 1:
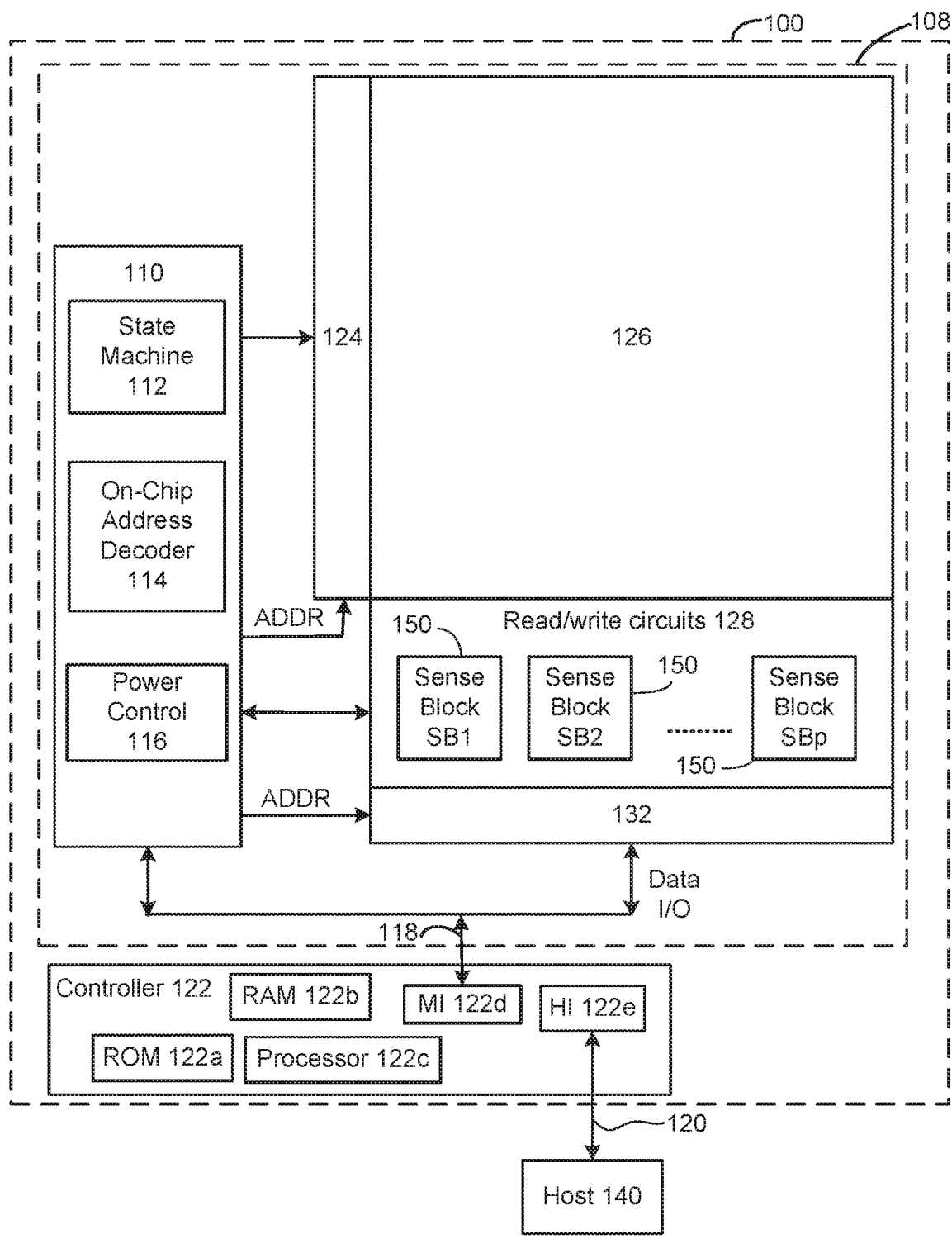
FIG. 1 is a functional block diagram of a memory device.

Techniques are provided for pre-charging NAND strings during a programming operation. A NAND string comprises a number of memory cells connected in series between one or more drain-side select transistors (or SGD transistors), on a drain-end of the NAND string which is connected to a bit line, and one or more source-source select transistors (or SGS transistors), on a source-end of the NAND string which is connected to a source line. A NAND string may have a number of data memory cells and may have dummy memory cells. A data memory cell is used to store user or system data. A dummy memory cell is not used to store user or system data.

During a programming operation involving a group of NAND strings, some memory cells are to receive programming (e.g., "selected memory cells"), whereas other memory cells are not to be subjected to programming (e.g., "unselected memory cells"). Program disturb is the unintended programming of an unselected memory cell while performing a programming process for selected memory cells.

A programing operation has a channel pre-charge phase followed by a programming phase in which a programming voltage is applied to a selected word line and boosting voltages are applied to unselected word lines, in one embodiment. A "selected word line" in the context of a programming operation, is a word line that is connected to at least one memory cell (e.g., selected memory cell) that is to receive programming. An "unselected word line" in the context of a programming operation, is a word line that is not connected to any memory cells that are to receive programming. Note that the selected word line may be connected to both selected memory cells and unselected memory cells.

The boosting voltages boost the voltage of the channel of a NAND string (e.g., "unselected NAND string") that does not have a memory cell that is selected for programming to prevent or at least reduce program disturb of one or more memory cells coupled to the unselected NAND string. If the channel of the unselected NAND string is not adequately pre-charged during the pre-charge phase, the NAND channel may fail to boost to a sufficient voltage during the programming phase to adequately prevent program disturb. For example, the unselected NAND string may have an unselected memory cell that is connected to a selected word line. If the channel of this unselected memory cell is not adequately pre-charged during the pre-charge phase, the channel of this unselected memory cell may fail to boost to a sufficient voltage during the programming phase to adequately prevent program disturb of this unselected memory.

The NAND strings are in a block that is divided into vertical sub-blocks, in one embodiment. The NAND strings run vertically through a stack of alternating horizontal conductive layers and horizontal dielectric layers, in one embodiment. The stack comprises tiers (also referred to as vertical sub-blocks), in one embodiment. Thus, each NAND string in the block resides in multiple vertical sub-blocks, in one embodiment. In one embodiment, there are at least three vertical sub-blocks. For the sake of discussion these will be referred to as a lower, middle, and upper vertical sub-blocks.

The different vertical sub-blocks can be treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block are programmed while there is valid data in the lower and/or the upper vertical sub-block. Programming the memory cells in middle vertical sub-block presents challenges due to the valid data in the other vertical sub-blocks. One challenge is to be able to prevent program disturb in an unselected memory cell in the middle vertical sub-block that is connected to a selected word line.

In one embodiment, during a pre-charge phase of a programming operation, an overdrive voltage is applied to some memory cells and a bypass voltage is applied to other memory cells. An overdrive voltage is defined herein as a voltage having a magnitude such that when applied to a control gate of a memory cell during a pre-charge phase of a programming operation, the memory cell will operate as a pass gate (e.g., conduct a current) whether the memory cell is in a programmed state or an erased state. The overdrive voltage allows the channel of an unselected NAND string to adequately charge during the pre-charge phase, such that program disturb is prevented, or at least reduced. A bypass voltage is defined herein as a voltage having a magnitude such that when applied to a control gate of a memory cell during a pre-charge phase of a programming operation, the memory cell will operate as a pass gate if the memory cell is in an erased state, but will not act as a pass gate for at least one programmed state. The technique allows, for example, programming of memory cells in a middle vertical sub-block without causing program disturb of unselected memory cells that are not to receive programming. In general, there may be two or more vertical sub-blocks. In one embodiment, there are two vertical sub-blocks. In one embodiment, there are more than three vertical sub-blocks.

FIG. 1-FIG. 4H describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes state machine 112, an on-chip address decoder 114, and a power control circuit 116. In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
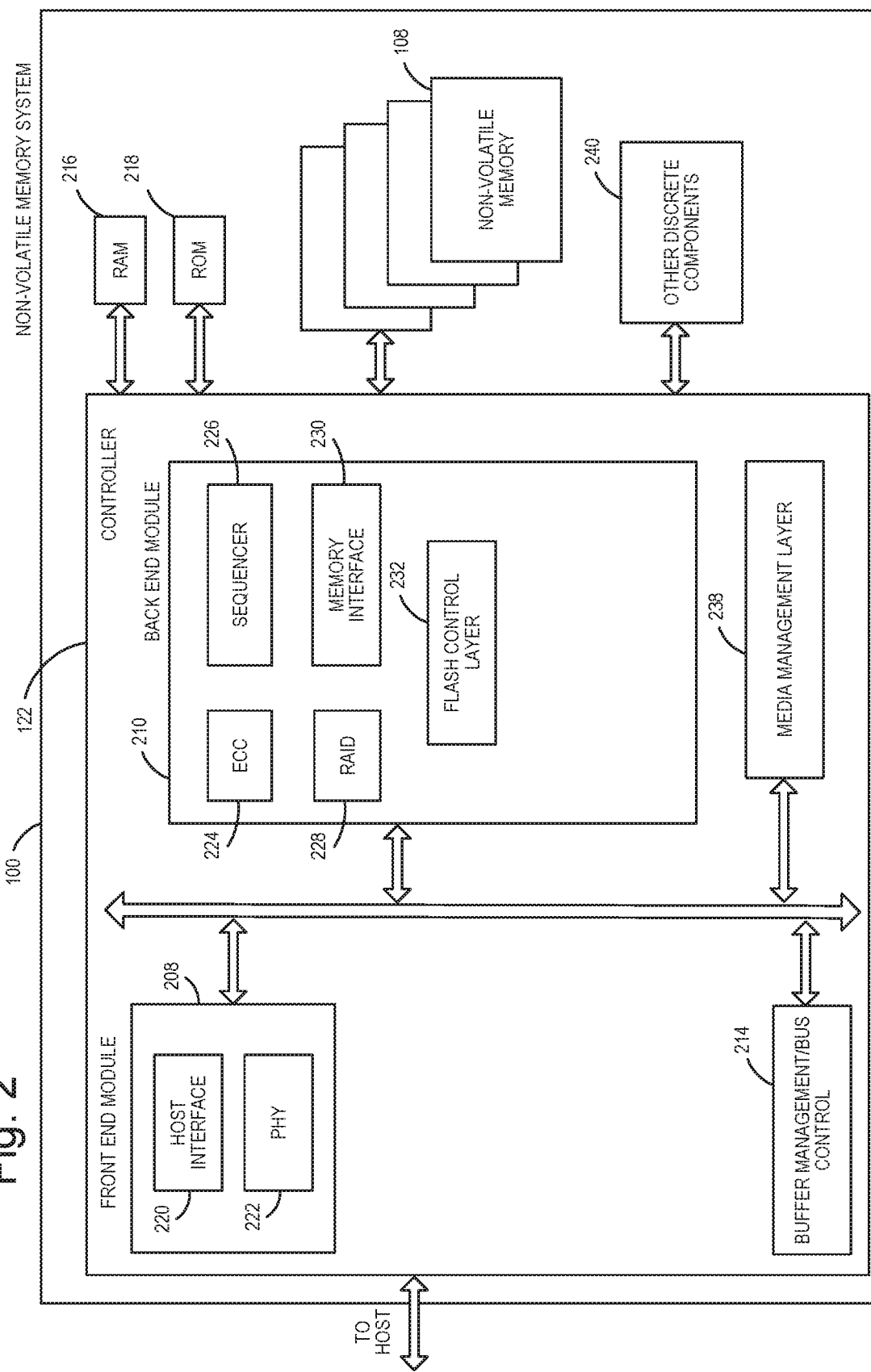
FIG. 2 is a block diagram depicting one embodiment of a memory system.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
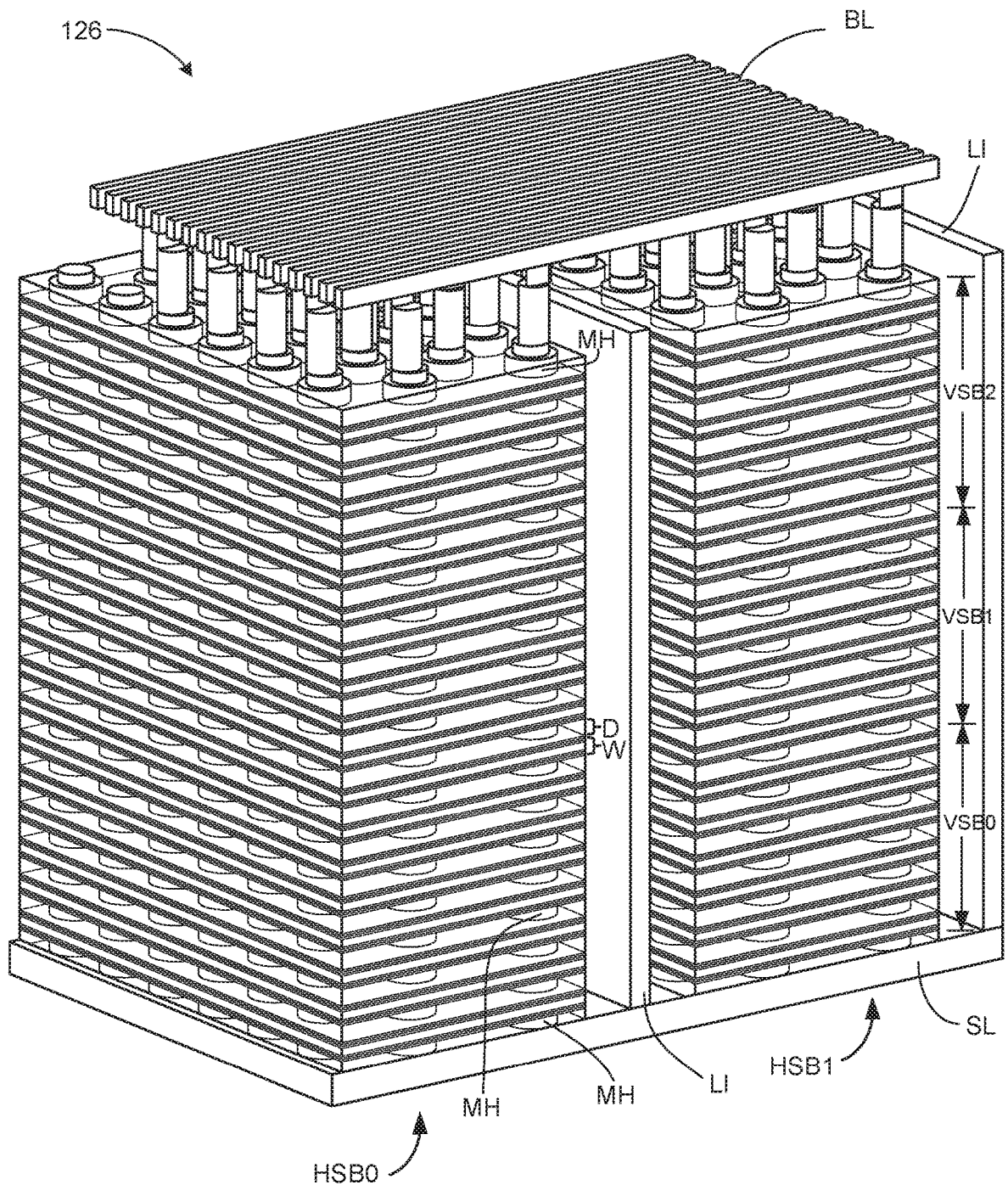
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126, which includes a plurality non-volatile memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 presents challenges due to the valid data in the other vertical sub-blocks VSB0, VSB2. One challenge is to be able to prevent program disturb in a memory cell in the middle vertical sub-block VSB1 that is connected to a selected word line, but that is not to receive programming.

In one embodiment, during a pre-charge phase of a programming operation of a selected memory cell in vertical sub-block VSB1, an overdrive voltage is applied to programmed memory cells in vertical sub-block VSB2, while applying a bypass voltage to one or more unprogrammed memory cells of vertical sub-block VSB1, and while applying a pre-charge voltage to a bit line (BL) connected to an unselected NAND string. The foregoing allows the channel of the unselected NAND string to adequately charge. During a programming phase, boosting voltages may be applied to word lines to boost the channel voltage of the unselected NAND string to thereby prevent program disturb of an unselected memory cell on the unselected NAND string when a program voltage is applied to a selected word line. The foregoing allows memory cells in the middle vertical sub-block VSB1 to be programmed while valid data exists in the upper vertical sub-block VSB2. The foregoing allows memory cells in the middle vertical sub-block VSB1 to be programmed even if valid data exists in the both the lower vertical sub-block VSB0 and the upper vertical sub-block VSB2.

In one embodiment, during a pre-charge phase of a programming operation of a selected memory cell in vertical sub-block VSB1, an overdrive voltage is applied to programmed memory cells in vertical sub-block VSB0, while applying a bypass voltage to one or more unprogrammed memory cells of vertical sub-block VSB1, and while applying a pre-charge voltage to a source line (SL) connected to an unselected NAND string. The foregoing allows the channel of the unselected NAND string to adequately charge. During a programming phase, boosting voltages may be applied to word lines to boost the channel voltage of the unselected NAND string to thereby prevent program disturb of an unselected memory cell on the unselected NAND string when a program voltage is applied to a selected word line. The foregoing allows memory cells in the middle vertical sub-block VSB1 to be programmed while valid data exists in the lower vertical sub-block VSB0. The foregoing allows memory cells in the middle vertical sub-block VSB1 to be programmed even if valid data exists in the both the lower vertical sub-block VSB0 and the upper vertical sub-block VSB2.

In one embodiment, the channel of the unselected NAND string is pre-charged from both the bit line and the source line. The foregoing allows the channel of the unselected NAND string to adequately charge. The foregoing allows memory cells in the middle vertical sub-block VSB1 to be programmed even if valid data exists in the both the lower vertical sub-block VSB0 and the upper vertical sub-block VSB2.

Figure 4A:
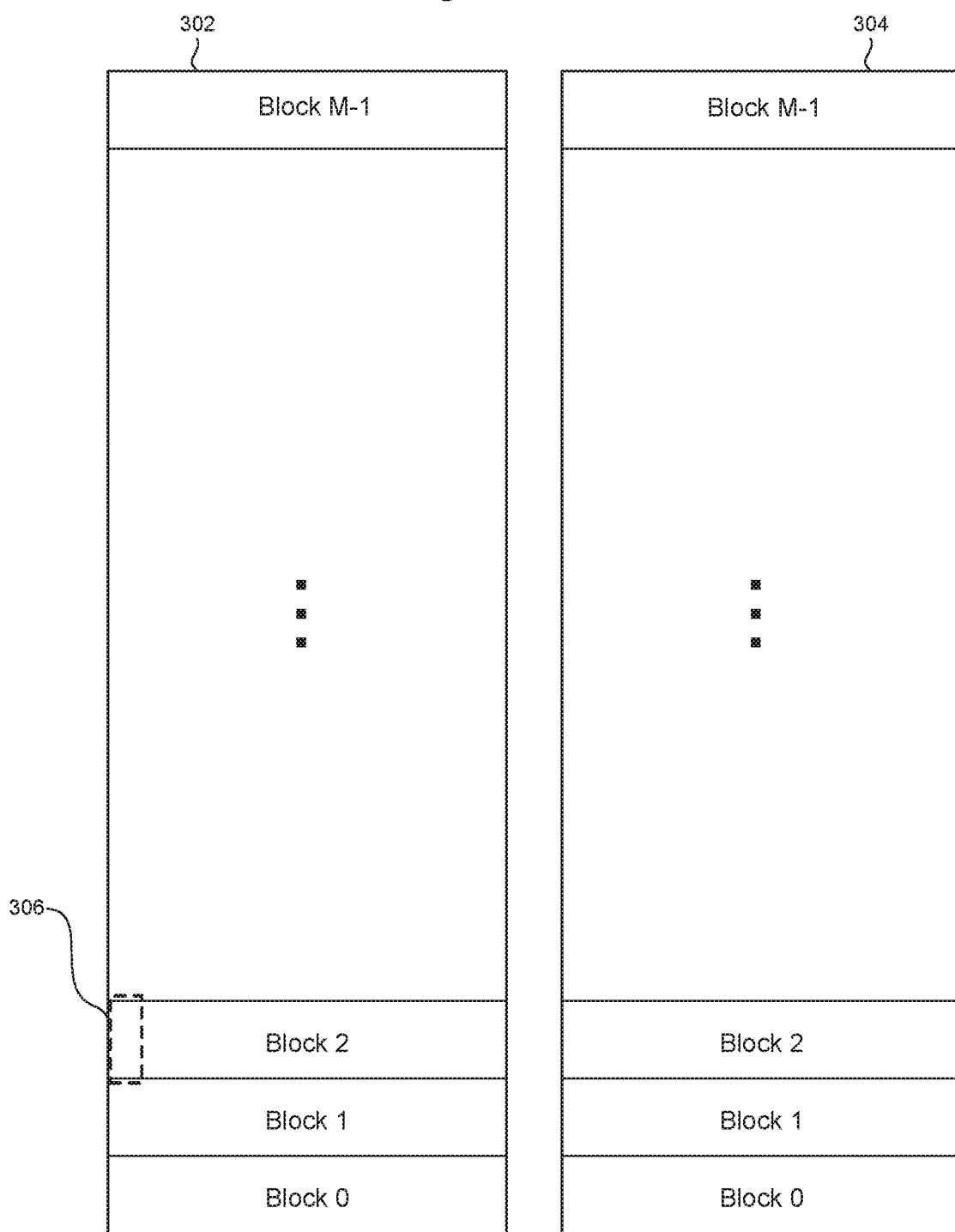
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

FIGS. 4B-4F depict an example three dimensional ("3D") NAND structure that corresponds to the structure of FIG. 3 and can be used to implement memory structure 126 of FIG. 2. FIG. 4B is a block diagram depicting a top view of a portion of one block from memory structure 126. The portion of the block depicted in FIG. 4B corresponds to portion 306 in block 2 of FIG. 4A. As can be seen from FIG.

4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
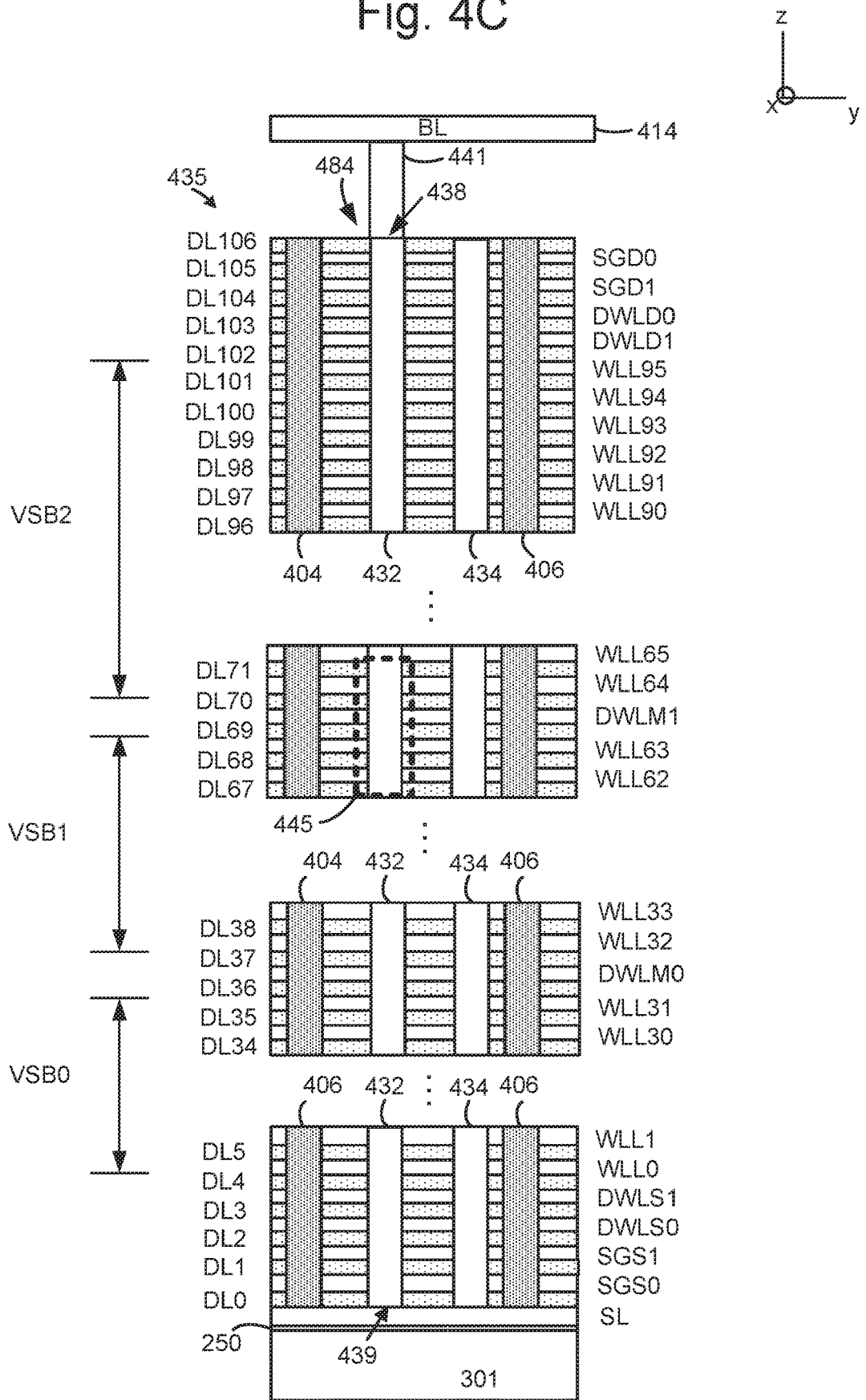
FIG. 4C depicts an embodiment of a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy word line layer DMLM0 is between vertical sub-block VSB0 and vertical sub-block VSB1. Dummy word line layer DMLM1 is between vertical sub-block VSB1 and vertical sub-block VSB2. The dummy word line layers have dummy memory cell transistors that may be used to electrically isolate a first set of memory cell transistors within the memory string (e.g., corresponding with vertical sub-block VSB0 word lines WLL0-WLL31) from a second set of memory cell transistors within the memory string (e.g., corresponding with the vertical sub-block VSB1 word lines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A word line that is connected to non-data transistors is referred to herein as a non-data word line. Examples of non-data word lines include, but are not limited to, dummy word lines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy word line layers DWLM in order to divide the stack 435 into the additional vertical sub-blocks. In one embodiment, the stack has two vertical sub-blocks.

Figure 4D:
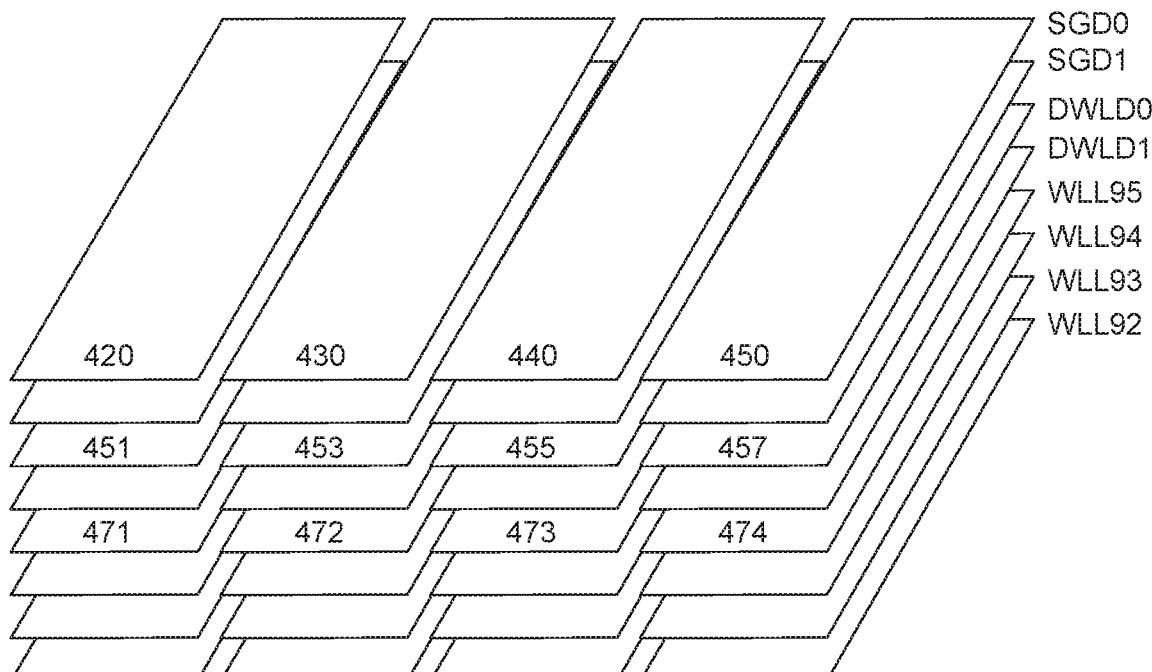
FIG. 4D depicts an alternative view of the select gate layers and word line layers of the stack 435 of FIG. 4C.
Figure 4D:
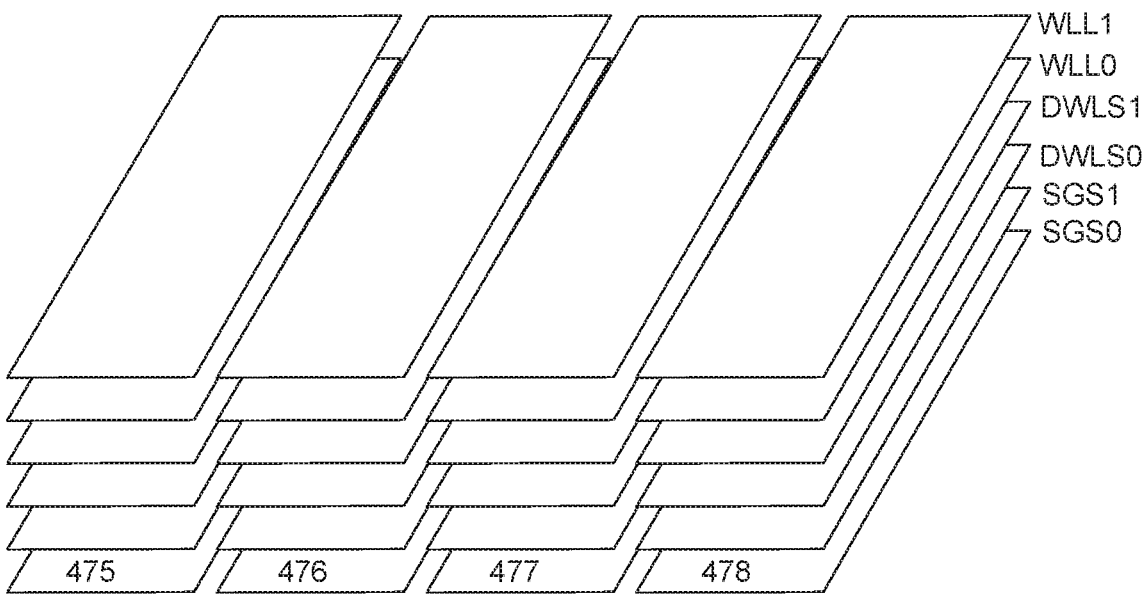

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL95 comprises word line layer regions 471, 472, 473 and 474.

Below the data word line layers are the source-side dummy word line layers.

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or, the SG lines can be connected and commonly controlled.

Figure 4E:
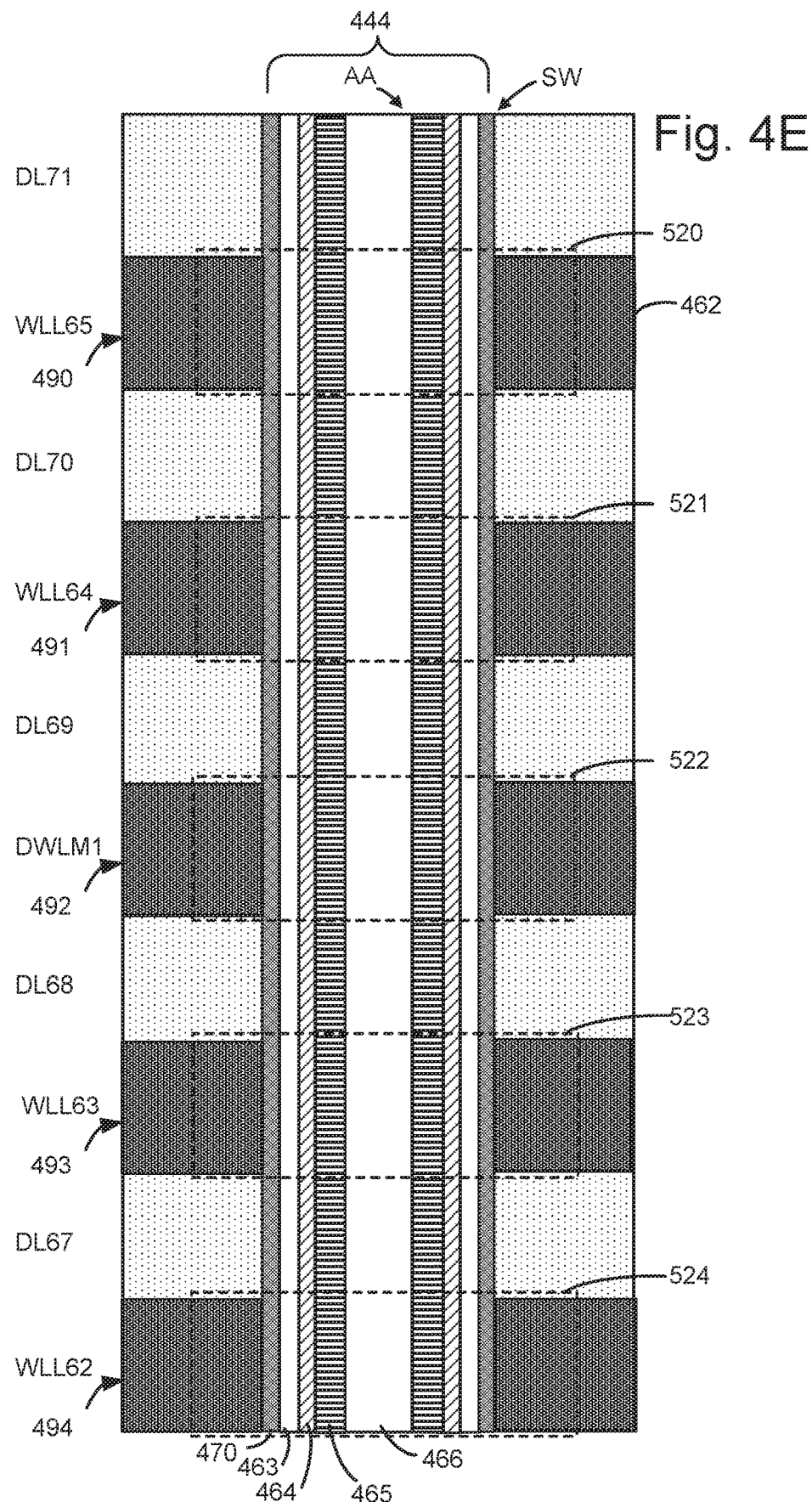
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are \data memory cell transistors 523 and 524. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Figure 4F:
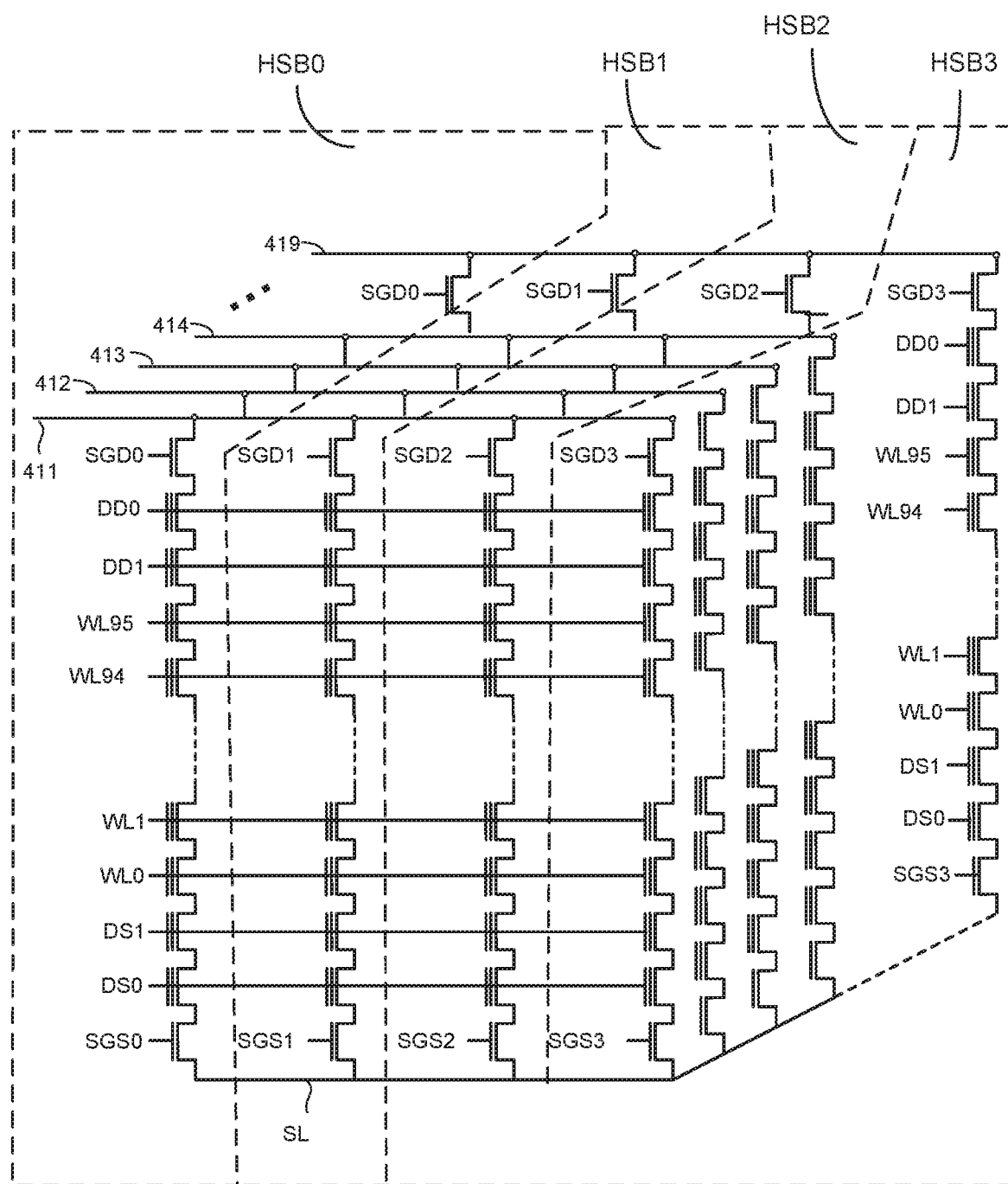
FIG. 4F is a schematic of a plurality of NAND strings showing multiple horizontal sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
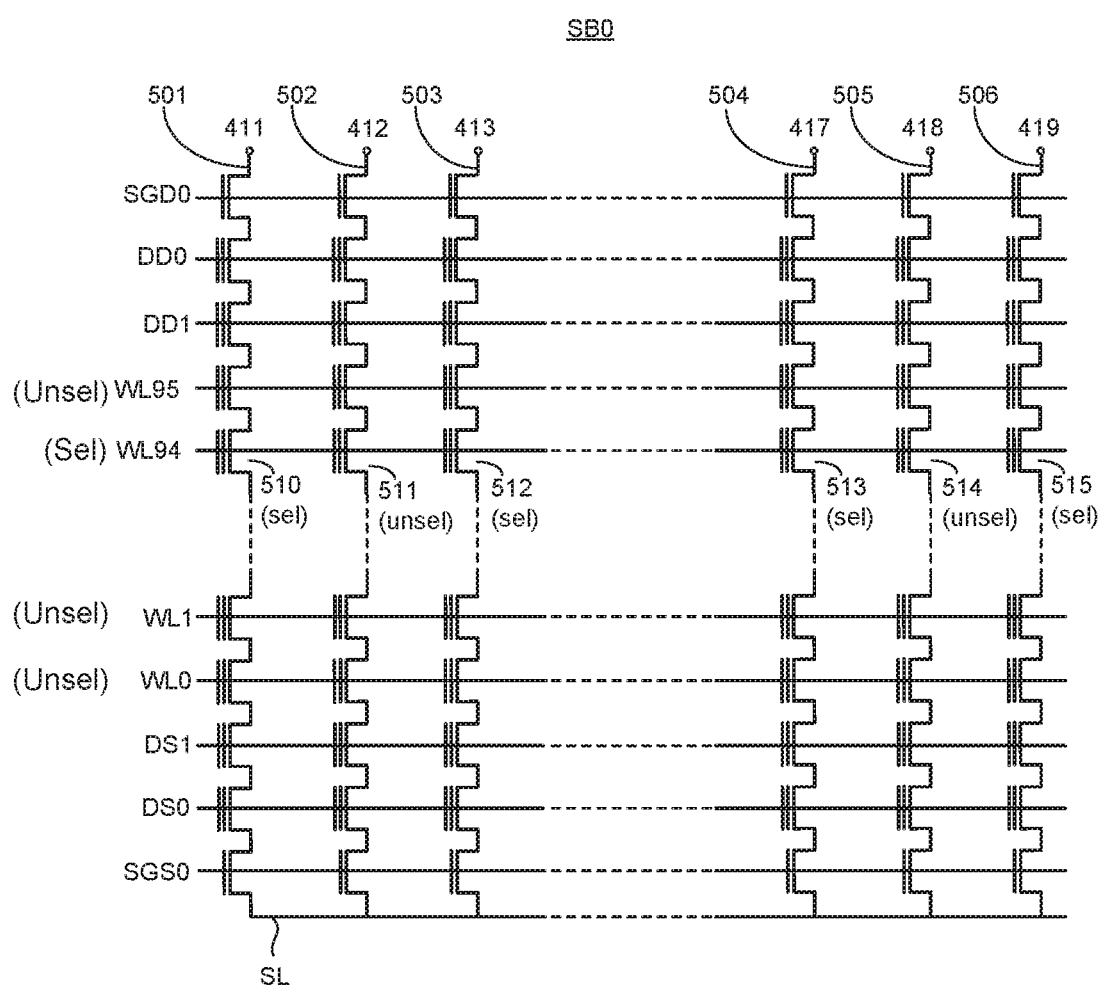
FIG. 4G is a schematic of a plurality of NAND strings showing one horizontal sub-block.

FIG. 4G is a schematic of horizontal sub-block HSB0. Horizontal sub-blocks HSB1, HSB2 and HSB3 have similar structures. FIG. 4G shows physical word lines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same word line as selected memory cells. Unselected memory cells may also be connected to different word lines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that word line WL94 and horizontal sub-block HS0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to word line WL94) are to remain in the erased state; therefore, memory cells 511 and 514 are unselected memory cells (labeled unsel in FIG. 4G). Additionally, assume for example purposes that memory cells 510, 512, 513 and 515 (which are connected to word line WL94) are to be programmed to any of the data states S1-S7; therefore, memory cells 510, 512, 513 and 515 are selected memory cells (labeled sel in FIG. 4G).

4H is a schematic diagram of a NAND string. The NAND string 600 is similar to the NAND string 484 in FIG. 4C, but has middle junction transistors to separate vertical sub-blocks. The NAND string 600 comprises a first portion of the NAND string (e.g., corresponding with vertical sub-block VSB0), a second portion of the NAND string (e.g., corresponding with vertical sub-block VSB1), a third portion of the NAND string (corresponding with vertical sub-block VSB2), middle junction transistor (MJT1) 614 arranged between the first portion of the NAND string and the second portion of the NAND string, and middle junction transistor (MJT2) 620 arranged between the second portion of the NAND string and the third portion of the NAND string.

Figure 4H:
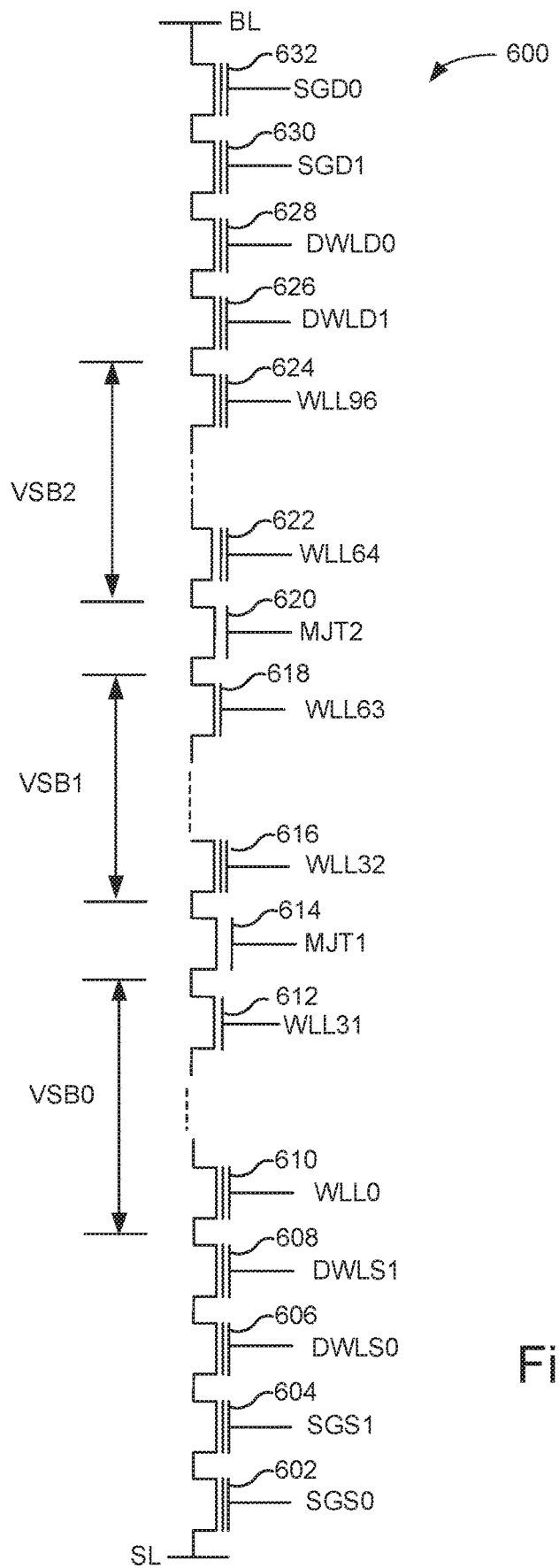
FIG. 4H is a schematic diagram of a NAND string.

The first portion of the NAND string has memory cells 610-612 connected to word lines WLL0-WLL31. The second portion of the NAND string has memory cells 616-618 connected to word lines WLL32-WLL63. The third portion of the NAND string has memory cells 622-624 connected to word lines WLL64-WLL96. Not all memory cells of NAND string 600 are depicted in FIG. 4H. Also included on the NAND string 600 is a first source-side select gate transistor 602 connected to SGS0, a second source-side select gate transistor 604 connected to SGS1, two dummy memory cell transistors 606, 608 connected respectively to DWLS0 and DWLS1, two dummy memory cell transistors 626, 628 connected respectively to DWLD0 and DWLD1, a drain-side select gate transistor 630 connected to SGD1, a drain-side select gate transistor 632 connected to SGD0. Drain-side select gate transistor 632 is connected to a bit line (BL). First source-side select gate transistor 602 is connected to a source line (SL). In one embodiment, there is a dummy memory cell transistor on each side of each middle junction transistor 614, 618.

According to different embodiments, each middle junction transistor 614, 618 may be a programmable transistor, such as a floating gate transistor or a charge trap transistor, or a non-programmable transistor, such as an NMOS transistor or a PMOS transistor. Each middle junction transistor 614, 618 may comprise an NMOS transistor without a charge trap layer between the channel of the NMOS transistor and the gate of the NMOS transistor. In certain embodiments, one middle junction transistor 614, 618 may comprise a programmable transistor and another middle junction transistor 614, 618 may comprise a non-programmable transistor. Each middle junction transistor 614, 618 may have a transistor channel length that is different from the transistor channel lengths used for the memory cell transistors. The channel length may be greater than any of the transistor channel lengths used for the memory cell transistors. For example, the channel length may be three times greater than the transistor channel lengths used for the memory cell transistors. Each middle junction transistors 614, 618 may electrically isolate the memory cell transistors in different vertical sub-blocks when the middle junction transistor is set into a non-conducting state.

Although the example memory system of FIGS. 3-4H is a three dimensional memory structure that includes vertical NAND strings with charge-trapping material, other (2D and 3D) memory structures can also be used with the technology described herein.

Figure 5:
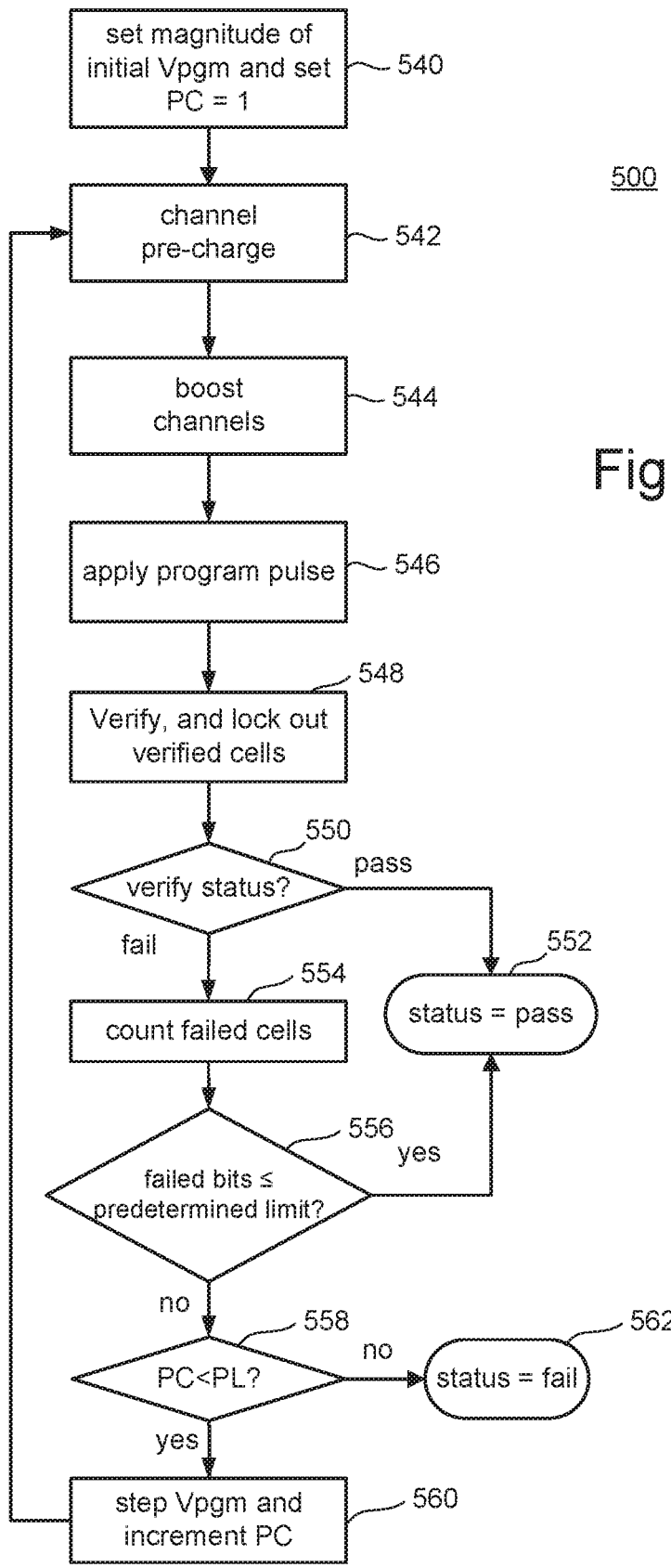
FIG. 5 is a flowchart describing one embodiment of a process for programming.

FIG. 5 is a flowchart describing one embodiment of a process 500 for programming NAND strings of memory cells organized into an array. In one example embodiment, the process of FIG. 5 is performed on memory die 108 using the control circuit discussed above. For example, the process of FIG. 5 can be performed at the direction of state machine 112. The process can be used to program a selected word line in a vertical sub-block. Memory cells in other vertical sub-blocks may store valid data when programming the selected word line. In some cases, there is at least one vertical sub-block between the vertical sub-block having the selected word line and the bit line. In some cases, there is at least one vertical sub-block between the vertical sub-block having the selected word line and the source line. In some cases, there is at least one vertical sub-block between the vertical sub-block having the selected word line and the bit line, and there is also at least one vertical sub-block between the vertical sub-block having the selected word line and the source line.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 540 of FIG. 5, the programming voltage (Vpgm) is initialized to the starting magnitude (e.g., ~12-16V or another suitable level) and a program counter PC maintained by state machine 112 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 (see FIG. 6) so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming. In some embodiments, the channel is pre-charged from the drain end of the NAND string. By "drain end" it is meant the end of the NAND string connected to the bit line. In some embodiments, the channel is pre-charged from the source end. By "source end" it is meant the end of the NAND string connected to the source line. In some embodiments, the channel is pre-charged from both the drain end and the source end.

In one embodiment, during the channel pre-charge phase, an overdrive voltage is applied to some memory cells and a bypass voltage is applied to other memory cells while a pre-charge voltage is applied to one or both ends of an unselected NAND string. The overdrive voltage helps to assure that the pre-charge voltage is passed to the channel of the unselected NAND string. Therefore, channel boosting (at step 544) is more effective, and program disturb is reduced or prevented.

In step 544, NAND strings that include memory cells connected to the selected word line that are to be inhibited from programming have their channels boosted to inhibit programming. In one embodiment, the unselected word lines receive one or more boosting voltages (e.g., ~7-11 volts) to perform boosting schemes.

In step 546, a program pulse of the program signal Vpgm is applied to the selected word line (the word line selected for programming). If a memory cell should be programmed, then the corresponding bit line is grounded, in one embodiment. On the other hand, if the memory cell should remain at its current threshold voltage, then the corresponding bit line is connected to Vdd to inhibit programming, in one embodiment. In step 546, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they are inhibited from programming.

In step 546, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 548, it is determined whether all the memory cells have reached their target threshold voltages (pass). If so, the programming process is complete and successful because all selected memory cells were programmed and verified to their target states. A status of "PASS" is reported in step 552. If, in 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed the verify process. This counting can be done by the state machine, the controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allows for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 558 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 560, the process loops back to step 542 and another program pulse is applied to the selected word line so that another iteration (steps 542-560) of the programming process of FIG. 5 is performed.

Figure 6:
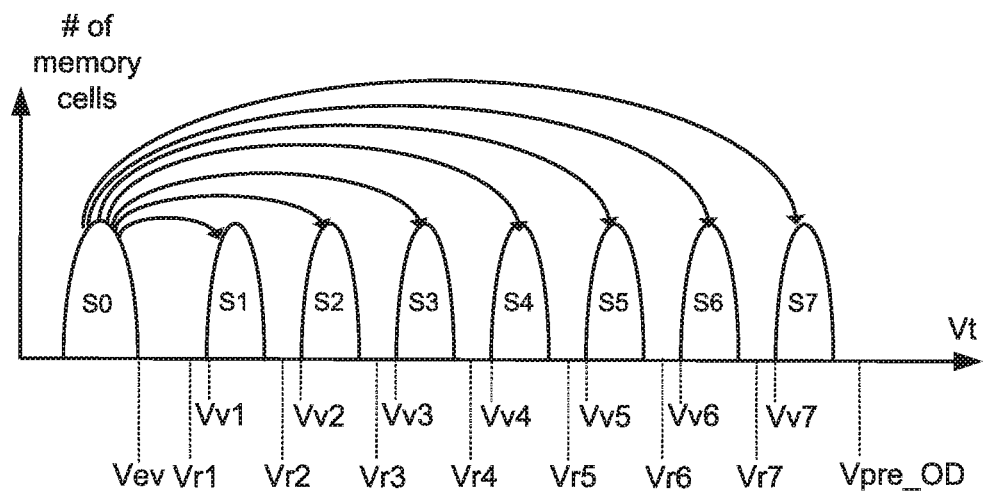
FIG. 6 illustrates example threshold voltage distributions for the memory array when each memory cell stores three bits of data.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions for the memory array when each memory cell stores three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 6 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. In some embodiments, data states S1-S7 can overlap, with controller 122 relying on error correction to identify the correct data being stored.

The technology described herein can also be used with other types of programming in addition to full sequence programming (including, but not limited to, multiple stage/phase programming). In one embodiment of multiple stage/phase programming, all memory cell to end up in any of data states S4-S7 are programmed to an intermediate state that is no higher than S4 in a first phase. Memory cells to end up in any of data states S0-S3 do not receive programming in the first phase. In a second phase, memory cells to end up in either data state S2 or S3 are programmed to a state that is no higher than S2; memory cells to end up in either data state S6 or S7 are programmed to a state that is no higher than S6. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 6) or verify operation (e.g. see verify target levels Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6 also shows an overdrive voltage Vpre_OD, which may be applied to control gates of data memory cells in step 542. The overdrive voltage is above all of the data states. Therefore, the overdrive voltage Vpre_OD will be above the threshold voltage of a data memory cell that is in any of the data states S0-S7. Thus, the overdrive voltage, when applied to a control gate of a data memory cell during a pre-charge phase of a programming operation, will cause the memory cell to operate as a pass gate (e.g., conduct a current) whether the memory cell is in a programmed state or an erased state.

The system uses a "bypass voltage" during the pre-charge phase of step 542, in one embodiment. The bypass voltage is at least Vev, but no greater than Vv7, in one embodiment. For example, the bypass voltage could be Vr1, Vv1, Vv2, etc. Thus, the bypass voltage, when applied to a control gate of a data memory cell during a pre-charge phase of a programming operation, will cause the memory cell to operate as a pass gate if the memory cell is in an erased state, but not act as a pass gate for at least one programmed state.

Figure 7:
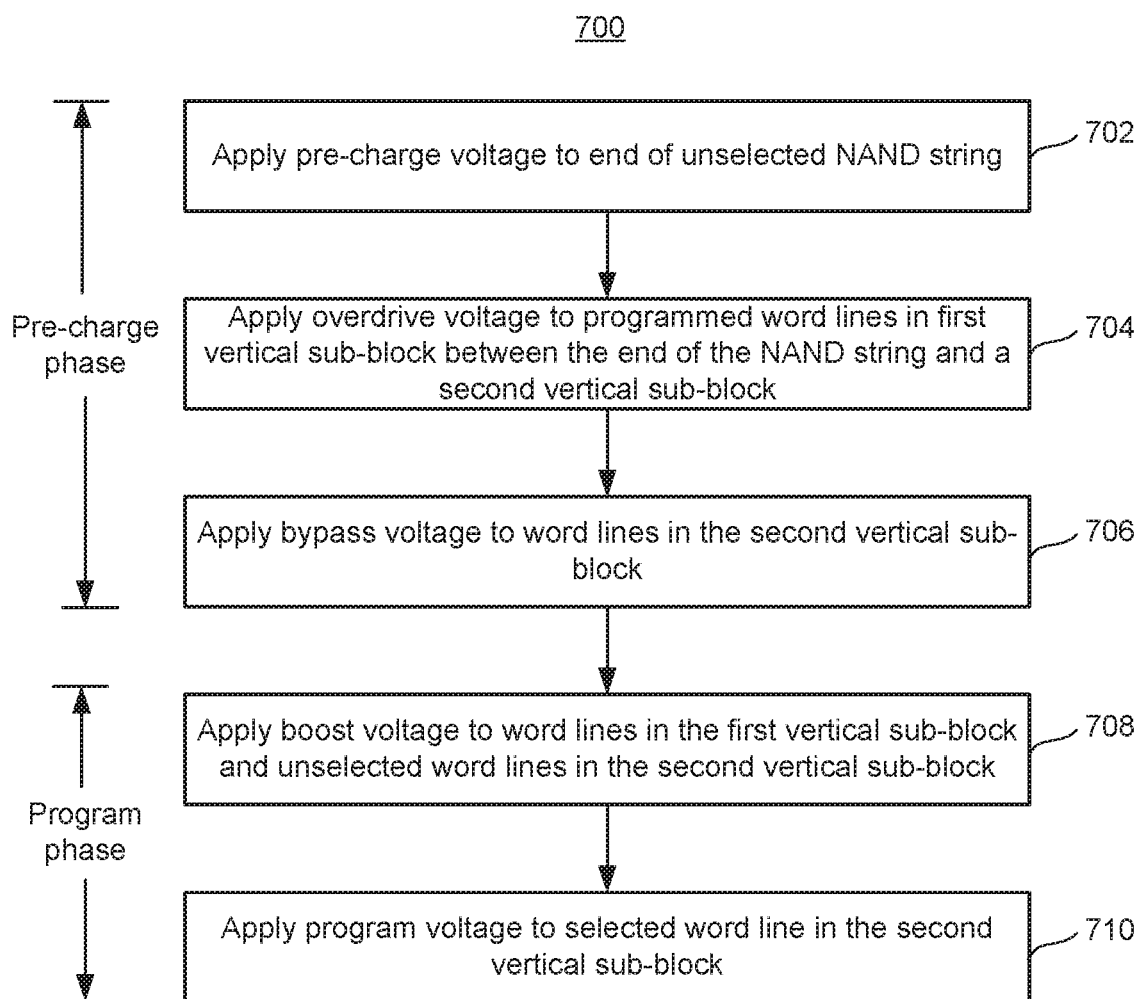
FIG. 7 is a flowchart of one embodiment of a process of inhibiting non-selected memory cells from programming during a programming operation.

FIG. 7 is a flowchart of one embodiment of a process 700 of inhibiting memory cells from programming during a programming operation. Process 700 may be performed once during each program loop of process 500. However, process 700 is not limited to use in process 500. The process 700 may be used to program selected memory cells of group of NAND strings. In particular, the NAND strings are connected to group of word lines, with one of the word lines being selected for programming. Some of the memory cells ("selected memory cells") connected to the selected word line are to be programmed, but other memory cells ("unselected memory cells") connected to the selected word line are to be inhibited from programming.

The process 700 can be used to program a selected word line in a vertical sub-block. Memory cells in other vertical sub-blocks may store valid data when programming the selected word line. In some cases, there is at least one vertical sub-block between the vertical sub-block having the selected word line and the bit line. In some cases, there is at least one vertical sub-block between the vertical sub-block having the selected word line and the source line. In some cases, there is at least one vertical sub-block between the vertical sub-block having the selected word line and the bit line, and there is also at least one vertical sub-block between the vertical sub-block having the selected word line and the source line. The process 700 will be described with respect to a first vertical sub-block and a second vertical sub-block. There is at least a third vertical sub-block, in one embodiment. In one embodiment, the first vertical sub-block is VSB2 and the second vertical sub-block is VSB1. In one embodiment, the first vertical sub-block is VSB0 and the second vertical sub-block is VSB1.

Process 700 is divided into a pre-charge phase and a program phase. The pre-charge phase (steps 702-706) may be performed in step 542 of process 500. Steps 702-706 may overlap in time. The program phase includes step 708 (which may be performed in step 544 of process 500) and step 710 (which may be performed in step 546 of process 500). The pre-charge phase is defined herein as a phase of a program operation of selected memory cells connected to a selected word line in which channels of unselected NAND strings connected to the selected word line are pre-charged to a desired voltage level. The program phase is defined herein as a phase of the program operation in which selected memory cells connected to the selected word line are programmed and unselected memory cells connected to the selected word line are inhibited from programming.

Step 702 includes applying a pre-charge voltage to an end of an unselected NAND string. The pre-charge voltage is a voltage that is used to pre-charge the channel of the unselected NAND string prior to boosting the channel. An example magnitude for the pre-charge voltage is 2.5V. Step 702 may include increasing a voltage at a first end of the unselected NAND string to a pre-charge voltage. In one embodiment, the pre-charge voltage is applied to a bit line connected to a drain side select transistor at one end of the unselected NAND string. In one embodiment, the pre-charge voltage is applied to a source line connected to a source side select transistor at the other end of the unselected NAND string. In one embodiment, a pre-charge voltage is applied to both the bit line and to the source line. These two pre-charge voltages could have the same magnitude, but that is not required.

Step 704 includes applying an over-drive voltage to programmed data word lines in a first vertical sub-block that is between the end of the NAND string to which the pre-charge voltage was applied and a second vertical sub-block. The over-drive voltage is applied while the first end of the NAND string is at the pre-charge voltage in step 702. In one embodiment, the over-drive voltage is applied to all programmed word in the first vertical sub-block. Herein, a "programmed data word line" refers to a word line having at least one memory cell that is in a programmed state. With reference to FIG. 4C, the first vertical sub-block may be VSB2 and the second vertical sub-block may be VSB1. With reference to FIG. 4C, the first vertical sub-block may be VSB0 and the second vertical sub-block may be VSB1. Process 700 is not limited to these examples.

In one embodiment, step 704 includes increasing the voltage on programmed data word lines in the first vertical sub-block and the second vertical sub-block to the overdrive voltage after the voltage on the first end of the unselected NAND string stabilizes at the pre-charge voltage. Waiting until the pre-charge voltage stabilizes may help to prevent or reduce effects such as hot electron injection disturb. This type of disturb may arise if the potential gradient in a region of the NAND channel is large enough to create electron/hole generation. Hot electrons which are created from the electron/hole generation can be injected into the charge trapping region of a memory cell, thereby causing program disturb.

Step 706 includes applying a bypass voltage to data word lines in the second vertical sub-block. The bypass voltage is applied while the first end of the NAND string is at the pre-charge voltage in step 702. The bypass voltage is applied while the overdrive voltage is being applied in step 704. In one embodiment, the bypass voltage is applied to all data word lines in the second vertical sub-block. The second vertical sub-block has one selected data word line and one or more unselected data word lines. The unselected data word lines may be programmed (e.g., one or more memory cells in a programmed state) or unprogrammed. An unprogrammed data word line refers to one in which all memory cells connected to the word line are in the erased state.

Step 708 includes applying a boost voltage to data word lines in the first vertical sub-block and unselected data word lines in the second vertical sub-block. A boost voltage can be applied to other data word lines as well. A different magnitude of boost voltage can be used for different word lines. Boost voltages may also be applied to dummy word lines. Step 708 boosts the voltage of the channel of the unselected NAND string after pre-charging the channel. Step 708 boosts the voltage of the channel of the unselected memory cell after pre-charging the channel of the unselected memory cell, in one embodiment. In one embodiment, step 708 raises voltage at the unselected memory cell from the pre-charge voltage to an inhibit voltage during the program phase in a program voltage (see step 710) is applied to the unselected memory cell. The inhibit voltage is defined as a voltage in the channel of the unselected memory cell configured to inhibit programming of the unselected memory cell.

Step 710 includes applying a program voltage to a selected word line in the second vertical sub-block. The program voltage is applied after the boost voltage has been applied to data word lines, and while the boost voltage continues to be applied to unselected data word lines. Thus, the program voltage is applied to the selected word line while maintaining the channel of the unselected NAND string at an inhibit (or "boosted") voltage. As noted above, the control gate of the unselected memory cell (on the unselected NAND string) is connected to the selected word line. Thus, the program voltage is applied to the control gate of the unselected memory cell while maintaining the channel of the unselected memory cell at an inhibit (or "boosted") voltage.

Figure 8A:
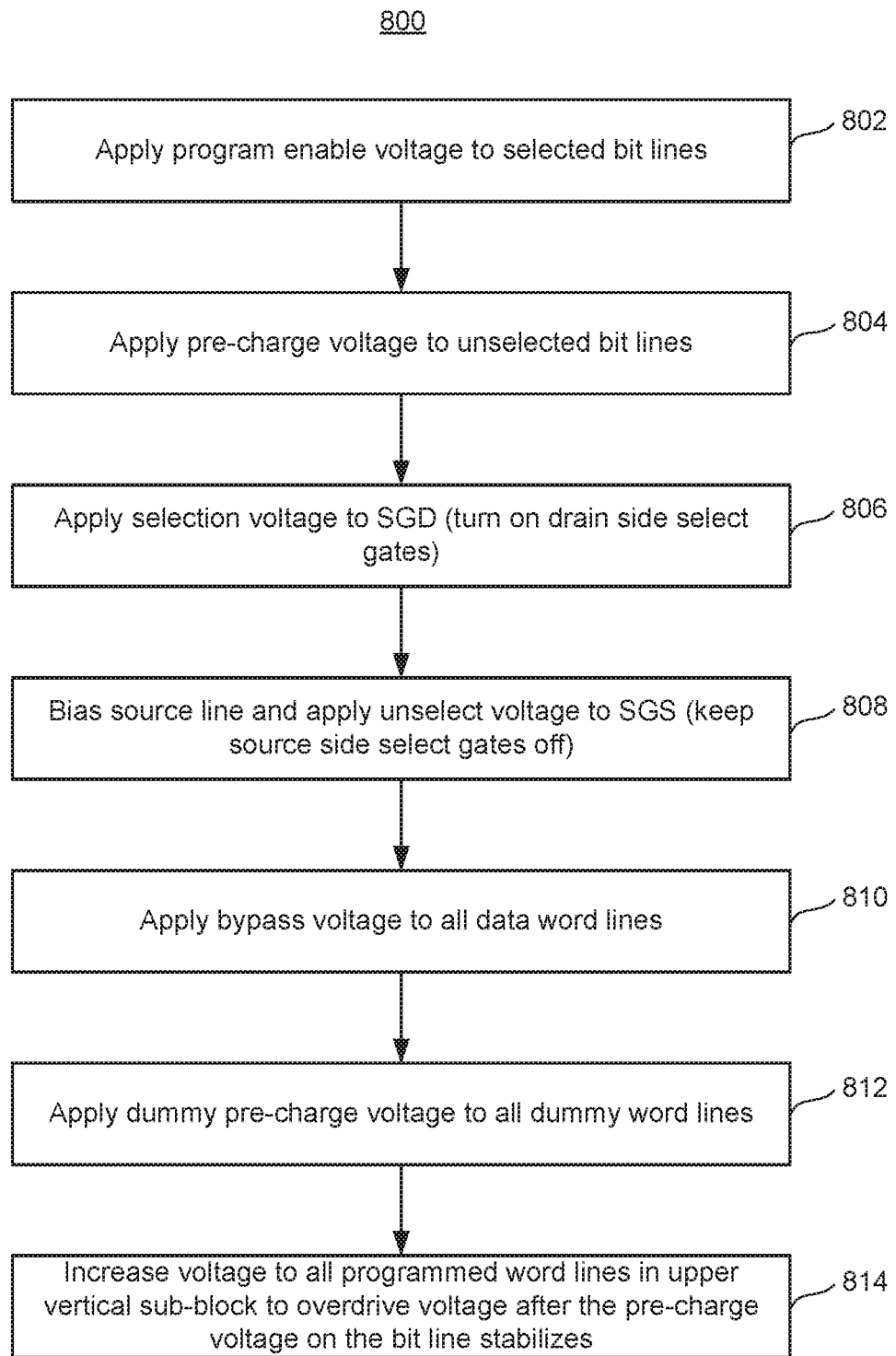
FIG. 8A is a flowchart of one embodiment of a process of a pre-charge phase of a program operation in which pre-charge is from a bit line.
Figure 8B:
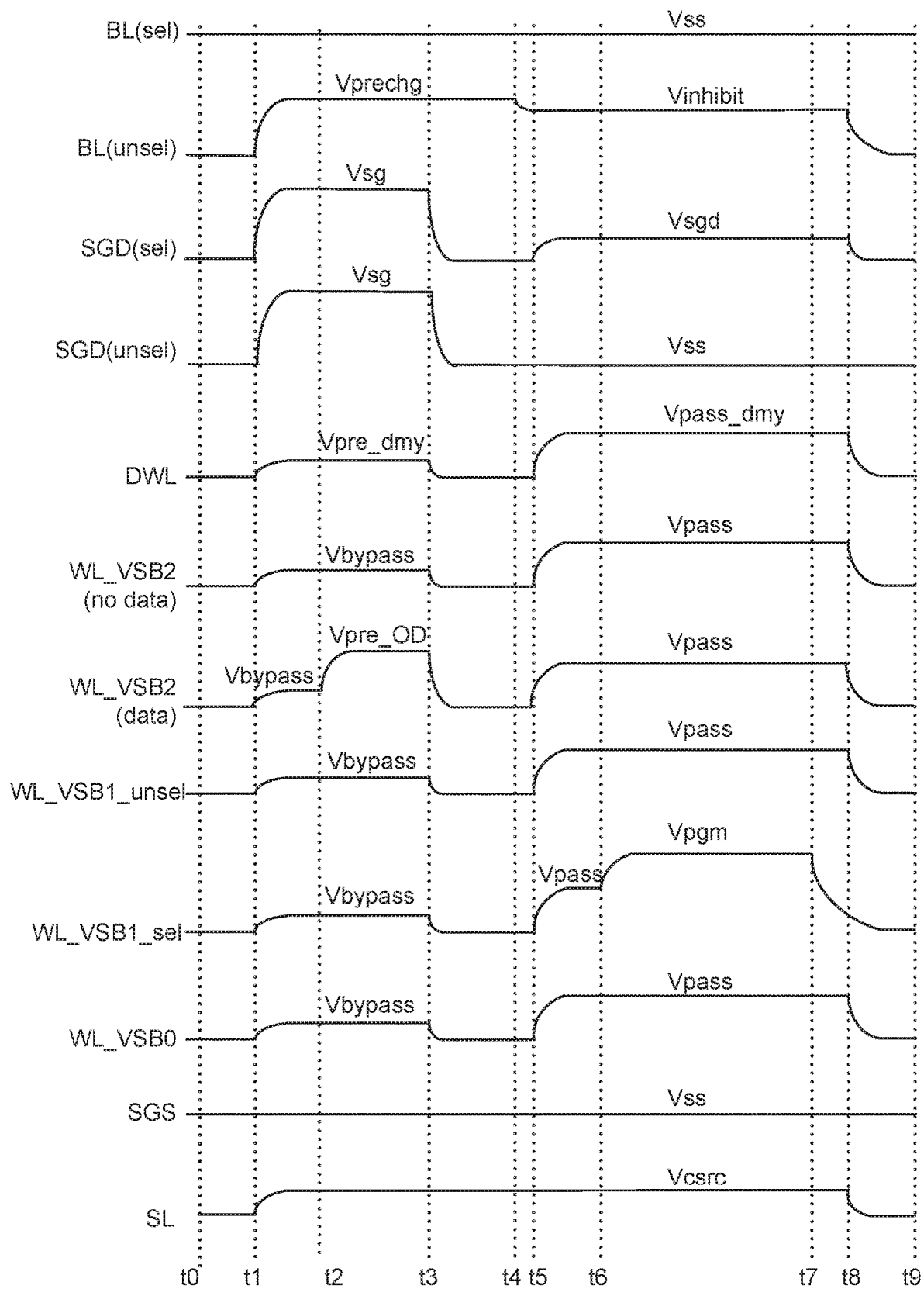
FIG. 8B shows timing of voltages during one embodiment of programming NAND having multiple vertical sub-blocks in which pre-charge is from a bit line.

FIG. 8A is a flowchart of one embodiment of a process 800 of a pre-charge phase of a program operation. In process 800, the channels of unselected NAND strings are pre-charged from the bit line. Process 800 may be used in step 542 of process 500. Process 800 provides details of one embodiment of the pre-charge phase (e.g., steps 702-706) of process 700. Process 800 will be described with respect to an upper vertical sub-block (e.g., VSB2), a middle vertical sub-block (e.g., VSB1), and a lower vertical sub-block VSB0, but is not limited thereto. The process 800 could be applied with just two vertical sub-blocks, or with more than three vertical sub-blocks. Process 800 will be described with respect to times t1-t4 of the timing diagram of FIG. 8B. FIG. 8B shows timing of voltages during one embodiment of programming NAND having multiple vertical sub-blocks. In general, times t1-t4 correspond to one embodiment of a pre-charge phase, and times t5-t9 correspond to one embodiment of a program phase.

In step 802, a program enable voltage is applied to selected bit lines. A selected bit line refers to a bit line that is connected to at least one NAND string having a memory cell to receive programming. The voltage on the selected bit line may be kept at this program enable voltage throughout the pre-charge phase, as well as during a program phase. The program enable voltage will enable programming of a selected memory cell during the programming phase. With reference to FIG. 8A, the voltage on the selected bit line (BL(sel)) is kept at Vss from time t0 to t9. Vss is 0V, in one embodiment.

In step 804, a pre-charge voltage is applied to unselected bit lines. An unselected bit line refers to a bit line for which each NAND string has a memory cell that is to be inhibited from programming. With reference to FIG. 8B, at time t1, the voltage on the unselected bit line (BL(unsel)) is raised towards the pre-charge voltage (Vprechg). An example of Vprechg is about 2.5V. The pre-charge voltage is maintained on the unselected bit line until time t4.

In step 806, a selection voltage is applied to a drain side select line (SGD) to turn on drain side select gates of NAND strings. The selection voltage may be applied to both selected and unselected SGD in a block. The SGD are used to select horizontal sub-blocks, in one embodiment. In a selected horizontal sub-block, at least one memory cell is selected for programming. In an unselected horizontal sub-block, no memory cell is selected for programming. Thus, a selected SGD is connected to at least one NAND string having a memory cell to receive programming. With reference to FIG. 8B, at time t1, the selected drain side select line(s) (SGD(sel)) are raised to Vsg (e.g., ~6 volts). With reference to FIG. 8B, at time t1, the unselected drain side select line(s) (SGD(unsel)) are raised to Vsg (e.g., ~6 volts). Turning on a drain side select transistor will connect the channel of the NAND string to a bit line. The select line voltages are maintained at Vsg until time t3.

In step 808, the source line is biased and an unselect voltage is applied to a source side selected line (SGS) to keep source side select gates off. With reference to FIG. 8B, at time t1, the voltage on the source line is raised to Vcsrc (e.g. ~2.5-3.5 volts). The voltage on the source side select lines (SGS) is kept at Vss from time t0 to t9.

In step 810, a bypass voltage is applied to data word lines. The bypass voltage may be applied to all data word lines. FIG. 8B shows voltages for data word lines in the upper vertical sub-block VSB2 that are not programmed (WL_VSB2(no data)), data word lines in the upper vertical sub-block VSB2 that are programmed (WL_VSB2(data)), data word lines in the middle vertical sub-block VSB1 that are not selected for programming (WL_VSB1(unsel)), the selected data word lines in the middle vertical sub-block VSB1 (WL_VSB1_sel), and data word lines in the lower vertical sub-block VSB0. At time t1 all of these data word lines are raised to V_bypass. The bypass voltage is maintained until time t3 for data word lines in VSB2 that are not programmed (WL_VSB2(no data)), data word lines in VSB1 that are not selected for programming (WL_VSB1 (unsel)), the selected data word lines in VSB1 (WL_VSB1_sel), and data word lines in VSB0.

In step 812, a dummy pre-charge voltage is applied to dummy word lines. The dummy pre-charge voltage may be applied to all dummy word lines. The dummy pre-charge voltage has a magnitude such that the dummy memory cells will operate as a pass gate (e.g., conduct a current). The magnitude can differ for the different dummy word lines. With reference to FIG. 8B, the voltage on the dummy word lines (WDL) is raised to Vpre_dmy at time t1 and maintained until time t3. An example of Vpre_dmy is 5V, assuming that the threshold voltage is less than 5V.

In step 814, the voltage on programmed word lines in the upper vertical sub-block VSB2 is increased from the bypass voltage to an overdrive voltage after the pre-charge voltage on the bit line stabilizes. With reference to FIG. 8B, at time t2, the voltage on WL_VSB2(data) is increased from V_bypass to Vpre_OD. Note that by time t2, the voltage on the unselected bit line has stabilized at Vprechg. Waiting until time t2 allows the pre-charge voltage on the unselected bit line to stabilize. Thus, time t2 is after the transient period in which the voltage on the unselected bit line increasing to Vprechg. Waiting until the pre-charge voltage stabilizes on the unselected bit line may help to prevent or reduce effects such as injection disturb. As discussed above, injection disturb can result in hot electrons being injected to the charge storage region of memory cells. Also, the overdrive voltage (Vpre_OD) is applied too soon, then the channel of the NAND string might not yet be conducting. Rather, the NAND string channel might be floating. Hence, by time t2, the NAND channel is conducting, in one embodiment.

Thus, with respect to FIG. 8B, between time t2 and t3, the channels of unselected NAND strings is pre-charged. FIG. 8C is a block diagram to illustrate one embodiment of charging the channels of unselected NAND strings from the bit line. The diagram represents four example NAND strings 811, 815, 817, and 819. The NAND strings may be part of the same block. With reference to FIG. 4F, each NAND string 811, 815, 817, and 819 resides in a different horizontal sub-block, in one embodiment. For example, NAND string 811 may reside in HSB0, NAND string 815 may reside in HSB1, NAND string 817 may reside in HSB2, and NAND string 819 may reside in HSB3. The four NAND strings 811, 815, 817, and 819 are connected to the same bit line (BL), and to the same source line (SL). For example, the four NAND strings 811, 815, 817, and 819 might be connected to bit line 411.

Each NAND string has memory cells in three vertical sub-blocks (VSB0, VSB1, VSB2). To simplify the drawing there are fewer memory cells per vertical sub-block in FIG. 8C, relative to FIG. 4F. The data word lines (WL0-WL17) and the dummy word lines (DWLs, DWL1, DWL2, DWLd)

are shared by the four NAND strings 811, 815, 817, and 819, as well as with other NAND strings in the block. The drain side select lines (SGD0, SGD1, SGD2, SGD3) are not shared by the four NAND strings 811, 815, 817, and 819, but are shared with other NAND strings in the block. The source side select lines (SGS0, SGS1, SGS2, SGS3) are not shared by the four NAND strings 811, 815, 817, and 819, but are shared with other NAND strings in the block.

All of the word lines (WL0-WL5) in VSB0 are programmed, in the example of FIG. 8C. Note that it might be that the memory cell (connected to a programmed word line) on a given NAND string is in the erased state. However, there is at least one memory cell (and likely many memory cells) that is in a programmed state on a programmed word line. Three of the word lines (WL12-WL14) in VSB2 are programmed, and three of the word lines (WL15-WL17) are unprogrammed. One of the word lines (WL7) in vertical sub-block VSB1 is selected for programming. However, the memory cells in NAND strings 811, 815, 817, and 819 connected to WL7 are not selected for programming. Hence, these memory cells are to be inhibited from programming when a program voltage is applied to the selected word line. The other word lines in VSB1 may be programmed or unprogrammed. In one embodiment, programming in VSB1 proceeds from WL6 to WL11. Thus, WL6 is programmed and WL8-WL11 are not yet programmed when WL7 is selected for programming, in one embodiment.

FIG. 8C shows the voltages that are applied between time t2 and t3 in the timing diagram in FIG. 8B. These voltages result in the pre-charge voltage passing from the bit line at least as far as the memory cells (on NAND strings 811, 815, 817, and 819) at the selected word line (WL7) in VSB1.

As noted herein, after the pre-charge phase, there is a programming phase. With reference to FIG. 8B, after time t3, the voltage on the SGD, DWL, and data word lines is brought down. However, the voltage on the unselected bit line may remain at the pre-charge voltage until time t4. At time t4, the voltage on the unselected bit line may be changed to an inhibit voltage. In one embodiment, the magnitude of Vinhibit and Vprechg are the same.

The time period of FIG. 8B from t5-t9 corresponds to a program phase in which channels of unselected NAND strings are boosted and a program voltage is applied to a selected word line (see steps 708 and 710 of FIG. 7). At time t4, the unselected bit lines are lowered from Vprecharge to Vinhibit (e.g. ~1-3.5 volts). Note that in some embodiments, Vprecharge and Vinhibit have the same magnitude. Vinhibit could be greater than Vprecharge. At time t5, the drain side selection line SGD(sel) connected to a selected horizontal sub-block is raised to Vsgd (e.g., ~3 volts), the selected word line WL_VSB1_sel is raised to a boosting voltage Vpass (e.g., 6-10 volts), the unselected data word lines (WL_VSB2 (no data), WL_VSB2(data), and WL_VSB1 unsel, WL_VSB0) are raised to the boosting voltage Vpass. The dummy word lines (DWL) are raised to a boosting voltage (Vpass_dmy). In some embodiments, the data word line will receive the same boosting voltage Vpass. In other embodiments different word lines may receive a different boosting voltage. For example, the magnitude of the boosting voltage may depend on the vertical sub-block.

Because the bit lines of unselected NAND strings will be at Vinhibit, the select gates will cut off the connected bit line from the channel and the boosting voltages (e.g., Vpass) will cause the channel voltage to increase (boosted). Because the channel voltage increases, the differential between the channel voltage (of the unselected memory cell) and the selected word line (and hence control gate of unselected memory cell) will be too small to allow for programming of the unselected memory cell.

At time t7, the selected word line WLn is lowered to ground. At time t8, the unselected bit lines BL(unsel), drain side selection line SGD(sel) for selected sub-blocks, dummy word lines (DWL), unselected data word lines (WL_VSB2 (no data), WL_VSB2(data), WL_VSB1 unsel, WL_VSB0) are lowered to ground.

Figure 9A:
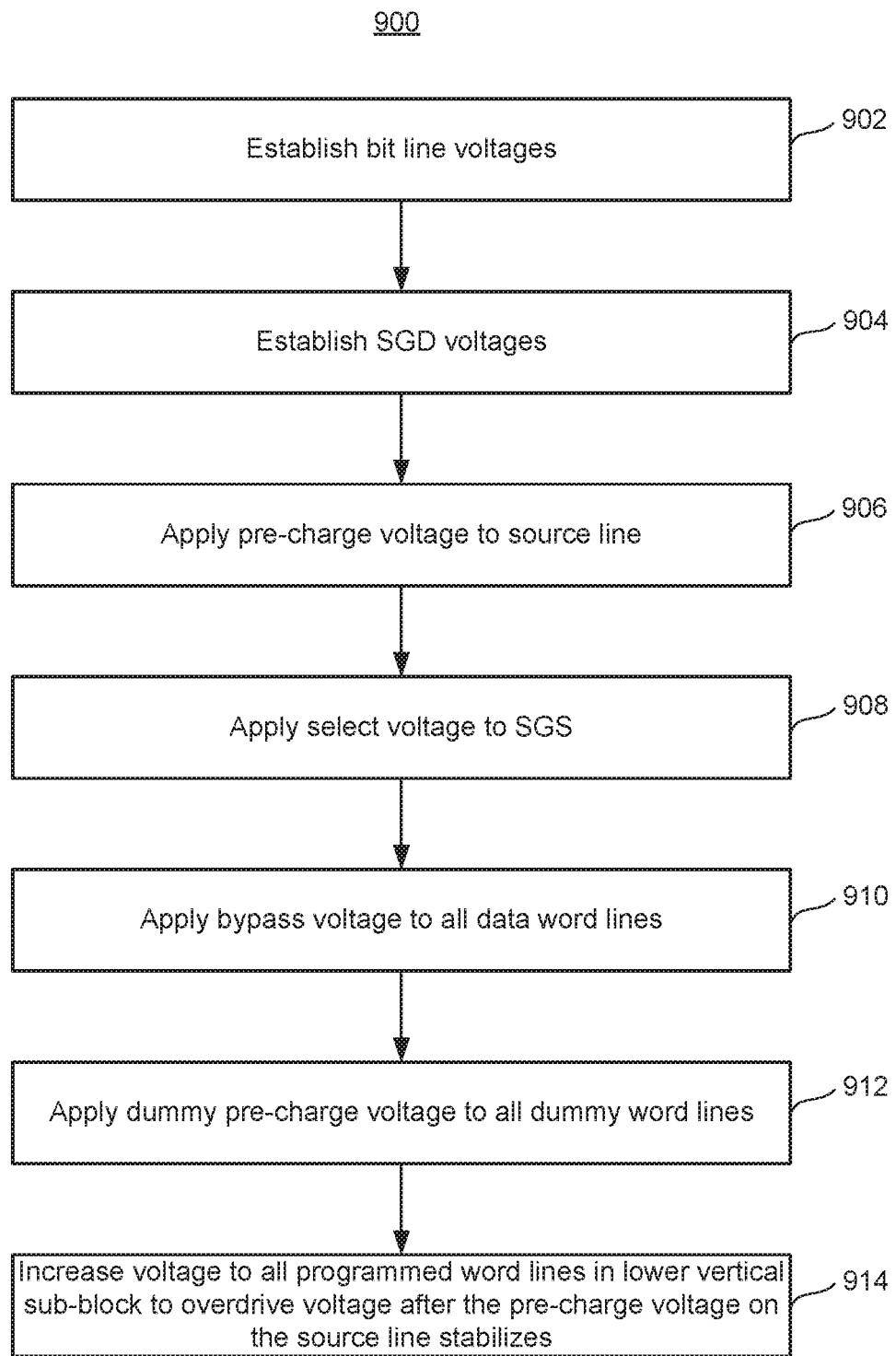
FIG. 9A is a flowchart of one embodiment of a process of a pre-charge phase of a program operation in which pre-charge is from a source line.
Figure 9B:
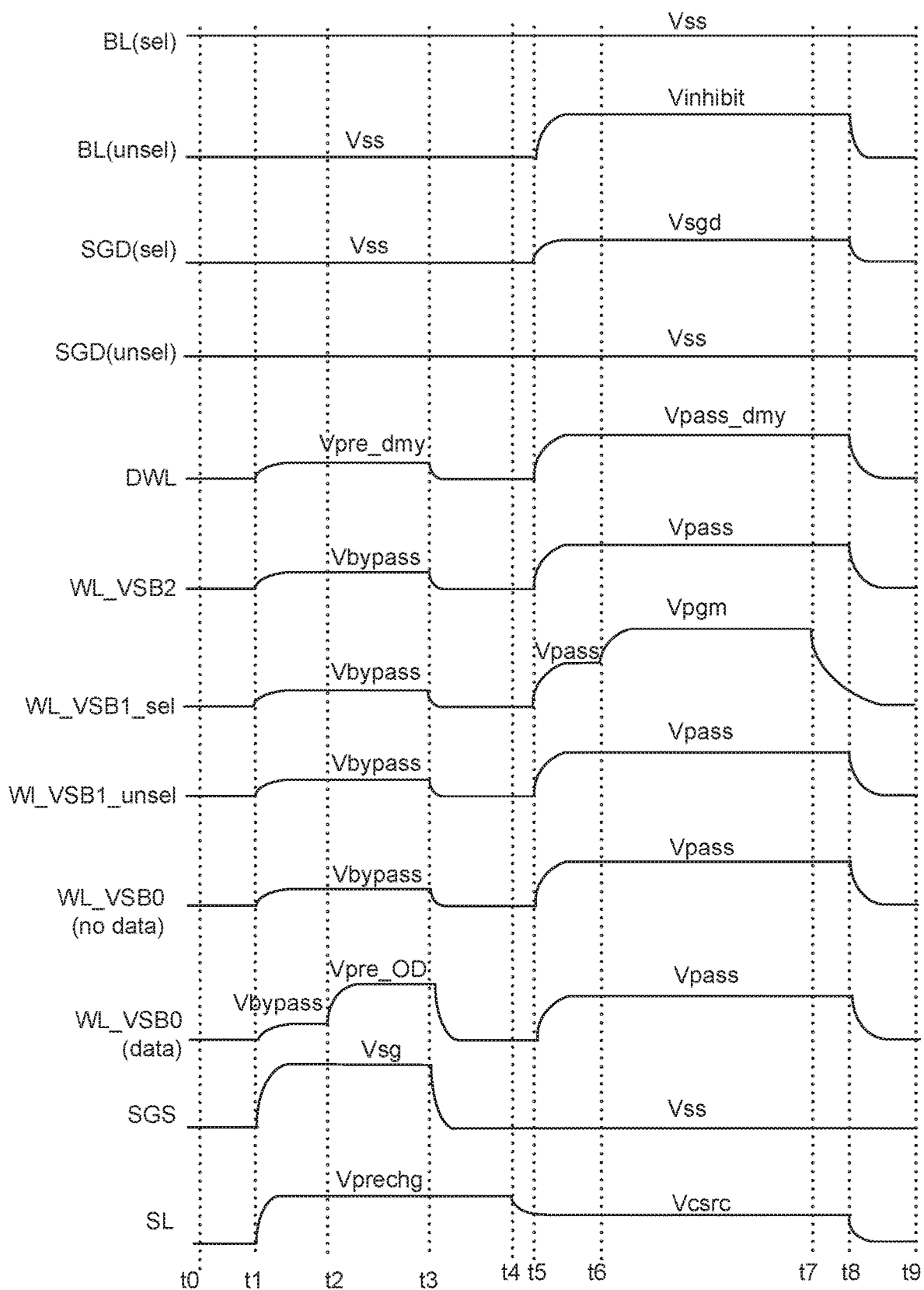
FIG. 9B shows timing of voltages during one embodiment of programming NAND having multiple vertical sub-blocks in which pre-charge is from a source line.

FIG. 9A is a flowchart of one embodiment of a process 900 of a pre-charge phase of a program operation. In process 900 the channels of unselected NAND strings are pre-charged from the source line. Process 900 may be used in step 542 of process 500. Process 900 provides details of one embodiment of the pre-charge phase (e.g., steps 702-706) of process 700. Process 900 will be described with respect to an upper vertical sub-block (e.g., VSB2), a middle vertical sub-block (e.g., VSB1), and a lower vertical sub-block VSB0, but is not limited thereto. The process 900 could be applied with just two vertical sub-blocks, or with more than three vertical sub-blocks. Process 900 will be described with respect to times t1-t4 of the timing diagram of FIG. 9B. FIG. 9B shows timing of voltages during one embodiment of programming NAND having multiple vertical sub-blocks. In general, times t1-t4 correspond to one embodiment of a pre-charge phase, and times t5-t9 correspond to one embodiment of a program phase.

In step 902, bit line voltages are established. With reference to FIG. 9A, the voltage on both the selected bit line (BL(sel)) and the unselected bit lines (BL(unsel)) are kept at Vss throughout the pre-charge phase from time t0 to t4. Vss is 0V, in one embodiment.

In step 904, voltages to the SGD lines are established. With reference to FIG. 9A, the voltage on both the SGD for selected horizontal sub-blocks (SGD(sel)) and the SGD for unselected horizontal sub-blocks (SGD(unsel)) are kept at Vss throughout the pre-charge phase from time t0 to t5. Vss is 0V, in one embodiment.

In step 906, a pre-charge voltage is applied to the source line. With reference to FIG. 9B, at time t1, the source line (SL) are raised to Vprecharge (e.g., ~2.5 volts). The pre-charge voltage is maintained on the source line until time t4.

In step 908, a selection voltage is applied to source side select lines (SGS) to turn on source side select gates of NAND strings. With reference to FIG. 9B, at time t1, the source side select line(s) (SGS) are raised to Vsg (e.g., ~6 volts). Turning on a source side select transistor will connect the channel of the NAND string to a source line. The SGS lines are maintained at Vsg until time t3.

In step 910, a bypass voltage is applied to data word lines. FIG. 9B shows voltages for data word lines in the lower vertical sub-block VSB0 that are not programmed (WL_VSB0(no data)), data word lines in the lower vertical sub-block VSB0 that are programmed (WL_VSB0(data)), data word lines in the middle vertical sub-block VSB1 that are not selected for programming (WL_VSB1(unsel)), the selected data word lines in the middle vertical sub-block VSB1 (WL_VSB1_sel), and data word lines in the upper vertical sub-block VSB2. At time t1 all of these data word lines are raised to V_bypass. The bypass voltage is maintained until time t3 for word lines in the lower vertical sub-block VSB0 that are not programmed (WL_VSB0(no data)), data word lines in the middle vertical sub-block VSB1 that are not selected for programming (WL_VSB1 (unsel)), the selected data word lines in the middle vertical sub-block VSB1 (WL_VSB1_sel), and data word lines in the upper vertical sub-block VSB2.

In step 912, a dummy pre-charge voltage is applied to all dummy word lines. This is a voltage that has a magnitude such that the dummy memory cells will operate as a pass gate (e.g., conduct a current). The magnitude can differ for the different dummy word lines. With reference to FIG. 9B, the voltage on the dummy word lines (WDL) is raised to Vpre_dmy at time t1 and maintained until time t3. An example of Vpre_dmy is 5V, assuming that the threshold voltage is less than 5V.

In step 914, the voltage on programmed word lines in the lower vertical sub-block VSB0 is increased from the bypass voltage to an overdrive voltage after the pre-charge voltage on the source line stabilizes. With reference to FIG. 9B, at time t2, the voltage on WL_VSB0(data) is increased from V_bypass to Vpre_OD. Note that by time t2, the voltage on the source line has stabilized at Vprechg. Waiting until time t2 allows the pre-charge voltage on the source line to stabilize. Thus, time t2 is after the transient period in which the voltage on the source line increasing to Vprechg. Waiting until the pre-charge voltage stabilizes on the source line may help to prevent or reduce effects such as injection disturb. Also, the overdrive voltage (Vpre_OD) is applied too soon, then the channel of the NAND string might not yet be conducting. Rather, the NAND string channel might be floating. Hence, by time t2, the NAND channel is conducting, in one embodiment.

Thus, with respect to FIG. 9B, between time t2 and t3, the channel of unselected NAND strings is pre-charged. FIG. 9C is a block diagram to illustrate one embodiment of charging the channels of unselected NAND strings from the source line. The diagram shows the four example NAND strings 811, 815, 817, and 819 of FIG. 8C, but under different conditions. Four of the word lines (WL0-WL3) in the lower vertical sub-block VSB0 are programmed, and two of the word lines (WL4-WL5) are not programmed, in the example of FIG. 9C. Three of the word lines (WL12-WL14) in the upper vertical sub-block VSB2 are programmed, and three of the word lines (WL15-WL17) are unprogrammed. One of the word lines (WL7) in the middle vertical sub-block VSB1 is selected for programming. However, the memory cells in NAND strings 811, 815, 817, and 819 connected to WL7 are not selected for programming. Hence, these memory cells are to be inhibited from programming when a program voltage is applied to the selected word line. The other word lines in VSB1 may be programmed or unprogrammed. In one embodiment, programming in the middle vertical sub-block VSB1 proceeds from WL11 to WL6. Thus, WL11-WL8 are programmed and WL6 is not yet programmed when WL7 is selected for programming, in one embodiment.

FIG. 9C shows the voltages that are applied between time t2 and t3 in the timing diagram in FIG. 9B. These voltages result in the pre-charge voltage passing from the source line at least as far as the memory cells (on NAND strings 811, 815, 817, and 819) at the selected word line (WL7) in VSB1.

After the pre-charge phase, there is a programming phase. With reference to FIG. 9B, the timing of the voltages between time t5-t9 is similar to the timing of the voltages between time t5-t9 in FIG. 8B.

Figure 10A:
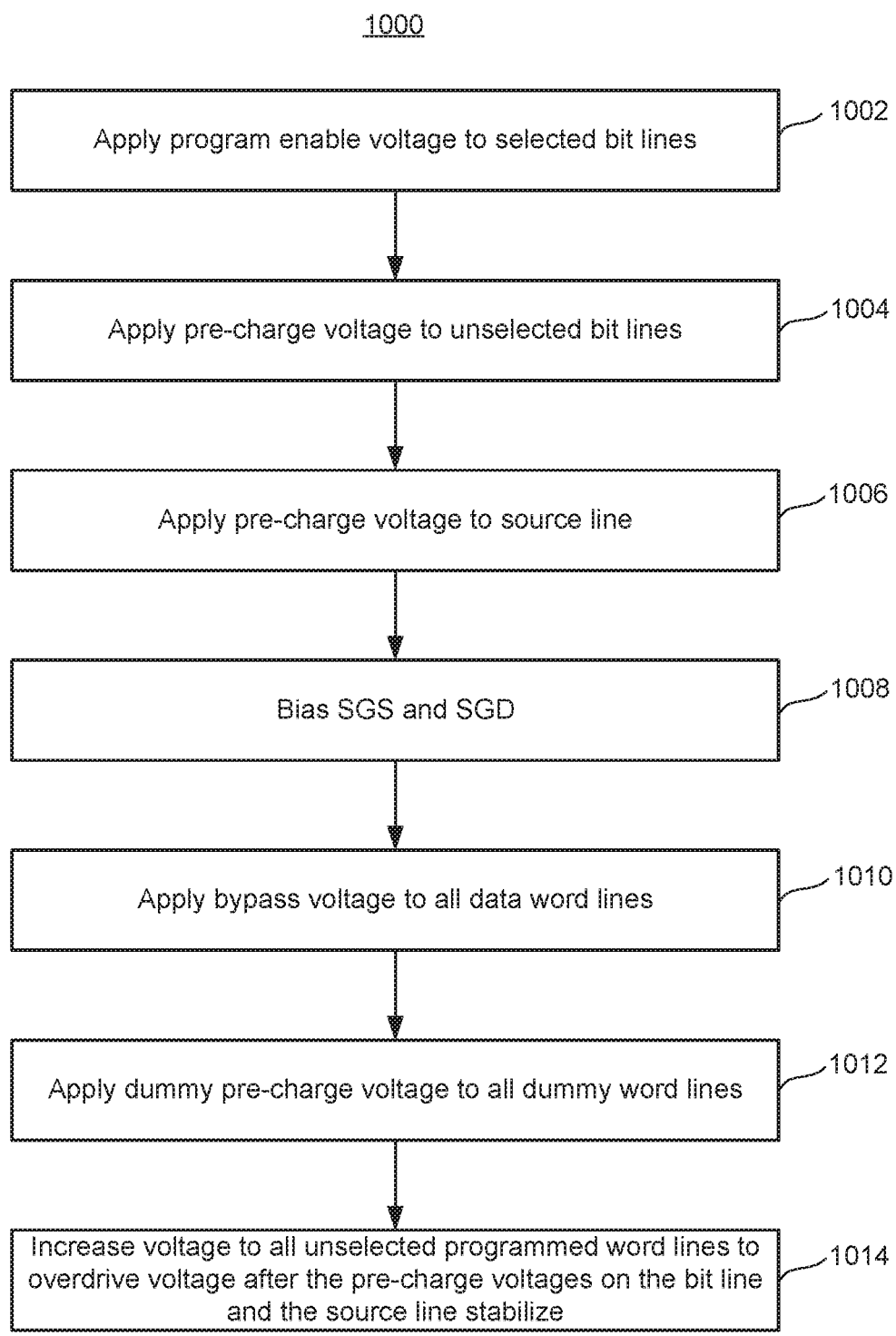
FIG. 10A is a flowchart of one embodiment of a process of a pre-charge phase of a program operation in which pre-charge is from both a bit line and a source line.
Figure 10B:
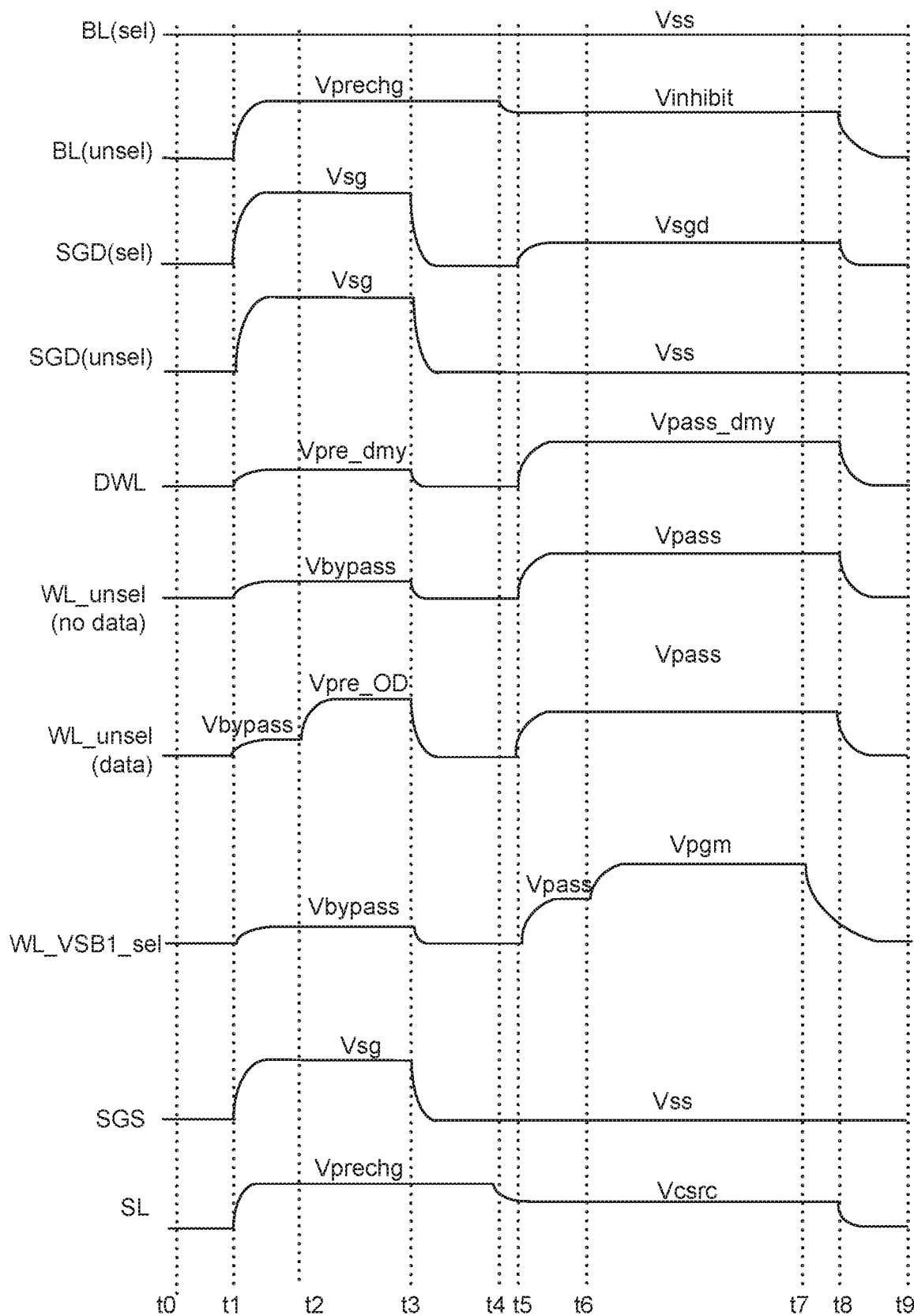
FIG. 10B shows timing of voltages during one embodiment of programming NAND having multiple vertical sub-blocks in which pre-charge is from both a bit line and a source line.

FIG. 10A is a flowchart of one embodiment of a process 1000 of a pre-charge phase of a program operation. In process 1000 the channels of unselected NAND strings are pre-charged from both the bit line and the source line. Process 1000 may be used in step 542 of process 500. Process 1000 provides details of one embodiment of the pre-charge phase (e.g., steps 702-706) of process 700. Process 1000 will be described with respect to times t1-t4 of the timing diagram of FIG. 10B. FIG. 10B shows timing of voltages during one embodiment of programming NAND having multiple vertical sub-blocks. In general, times t1-t4 correspond to one embodiment of a pre-charge phase, and times t5-t9 correspond to one embodiment of a program phase.

In step 1002, a program enable voltage is applied to selected bit lines. The voltage on the selected bit line may be kept at this program enable voltage throughout the pre-charge phase, as well as during a program phase. The program enable voltage will enable programming of a selected memory cell during the programming phase. With reference to FIG. 10A, the voltage on the selected bit line (BL(sel)) is kept at Vss from time t0 to t9. Vss is 0V, in one embodiment.

In step 1004, a pre-charge voltage is applied to unselected bit lines. With reference to FIG. 10B, at time t1, the voltage on the unselected bit line (BL(unsel)) is raised towards the pre-charge voltage (Vprechg). An example of Vprechg is about 2.5V. The pre-charge voltage is maintained on the unselected bit line until time t4.

In step 1006, a pre-charge voltage is applied to the source line. With reference to FIG. 10B, at time t1, the source line (SL) are raised to Vprecharge (e.g., ~2.5 volts). The pre-charge voltage is maintained on the source line until time t4.

In step 1008, voltages to the SGD and SGS lines are established. With reference to FIG. 10B, at time t1, the selected drain side select line(s) (SGD(sel)) are raised to Vsg (e.g., ~6 volts). With reference to FIG. 10B, at time t1, the unselected drain side select line(s) (SGD(unsel)) are raised to Vsg (e.g., ~6 volts). Turning on a drain side select transistor will connect the channel of the NAND string to a bit line. With reference to FIG. 10B, at time t1, the source side select line(s) (SGS) are raised to Vsg (e.g., ~6 volts). The select line voltages are maintained at Vsg until time t3.

In step 1010, a bypass voltage is applied to data word lines. FIG. 10B shows voltages for unselected data word lines that are not programmed (WL_unsel(no data)), unselected data word lines that are programmed (WL_unsel (data)), and the selected data word lines in VSB1 (WL_VSB1_sel). At time t1 all of these data word lines are raised to V_bypass. The bypass voltage is maintained until time t3 for unselected data word lines that are not programmed (WL_unsel(no data)) and the selected data word lines in VSB1 (WL_VSB1_sel).

In step 1012, a dummy pre-charge voltage is applied to all dummy word lines. This is a voltage that has a magnitude such that the dummy memory cells will operate as a pass gate (e.g., conduct a current). The magnitude can differ for the different dummy word lines. With reference to FIG. 9B, the voltage on the dummy word lines (WDL) is raised to Vpre_dmy at time t1 and maintained until time t3. An example of Vpre_dmy is 5V, assuming that the threshold voltage is less than 5V.

In step 1014, the voltage on unselected programmed word lines is increased from the bypass voltage to an overdrive voltage after the pre-charge voltage on both the bit line and source line stabilizes. With reference to FIG. 10B, at time t2, the voltage on WL_unsel(data) is increased from V_bypass to Vpre_OD. Note that by time t2, the voltage on both the bit line and the source line has stabilized at Vprechg. Waiting until time t2 allows the pre-charge voltages on the bit line and the source line to stabilize. Waiting until the pre-charge voltage stabilizes may help to prevent or reduce effects such as injection disturb. Also, the overdrive voltage (Vpre_OD) is applied too soon, then the channel of the NAND string might not yet be conducting. Rather, the NAND string channel might be floating. Hence, by time t2, the NAND channel is conducting, in one embodiment.

Figure 10C:
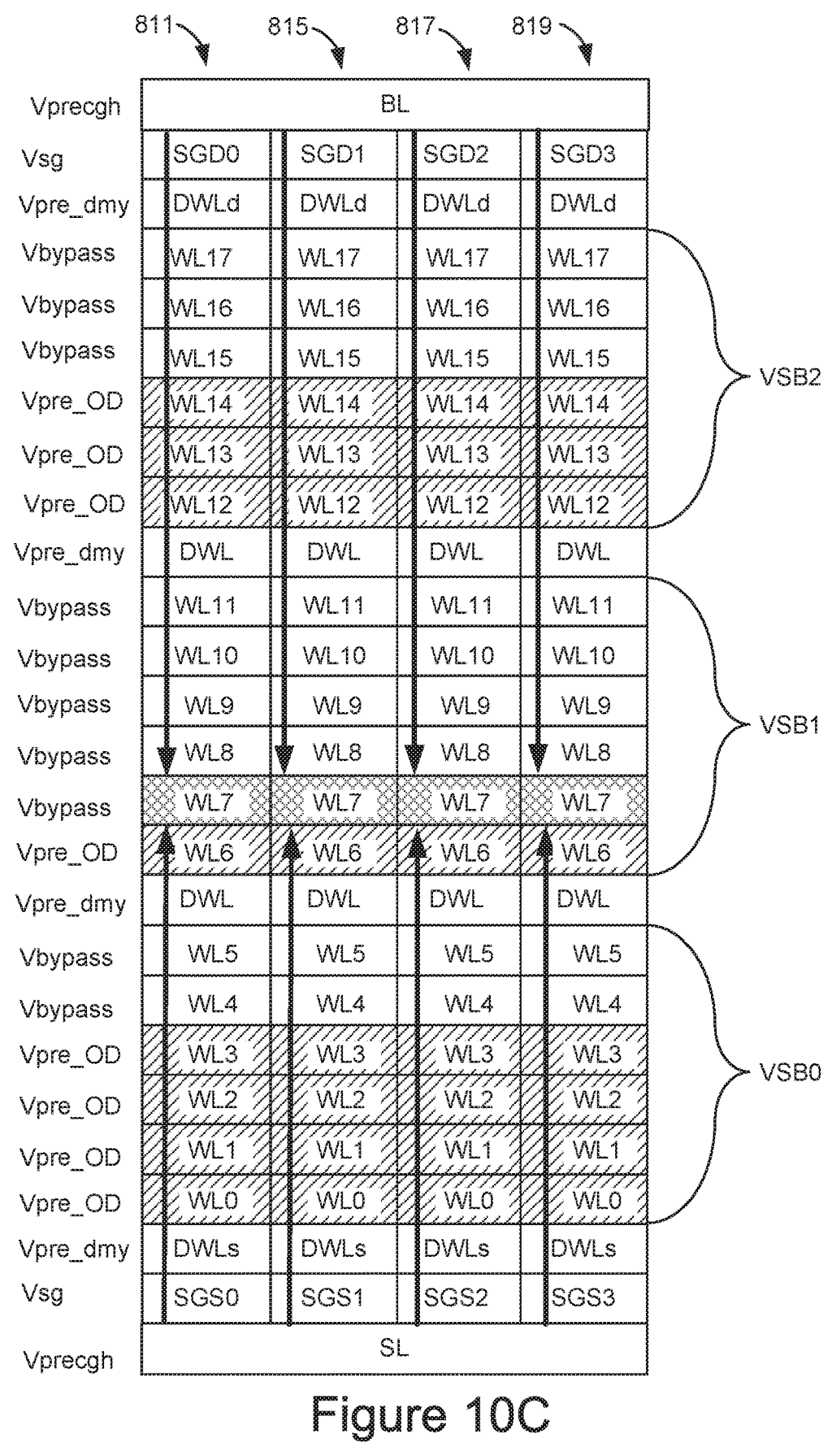

Thus, with respect to FIG. 10B, between time t2 and t3, the channel of unselected NAND strings is pre-charged. FIG. 10C is a block diagram to illustrate one embodiment of charging the channels of unselected NAND strings from both the bit line and the source line. The diagram shows the four example NAND strings 811, 815, 817, and 819 of FIGS. 8C and 9C, but under different conditions. Four of the word lines (WL0-WL3) in the lower vertical sub-block VSB0 are programmed, and two of the word lines (WL4-WL5) are not programmed, in the example of FIG. 9C. Three of the word lines (WL12-WL14) in the upper vertical sub-block VSB2 are programmed, and three of the word lines (WL15-WL17) are unprogrammed. One of the word lines (WL6) in vertical sub-block VSB1 is programmed. Four of the word lines (WL8-WL11) in the middle vertical sub-block VSB1 are not yet programmed. One of the word lines (WL7) in vertical sub-block VSB1 is selected for programming. However, the memory cells in NAND strings 811, 815, 817, and 819 connected to WL7 are not selected for programming. Hence, these memory cells are to be inhibited from programming when a program voltage is applied to the selected word line. In the example of FIG. 10C, programming in VSB1 proceeds from WL6 to WL11. However, programming could be performed in a different order.

FIG. 10C shows the voltages that are applied between time t2 and t3 in the timing diagram in FIG. 10B. These voltages result in the pre-charge voltage passing from the bit line at least as far as the memory cells (on NAND strings 811, 815, 817, and 819) at the selected word line (WL7) in VSB1. These voltages also result in the pre-charge voltage passing from the source line at least as far as the memory cells (on NAND strings 811, 815, 817, and 819) at the selected word line (WL7) in VSB1.

A first embodiment disclosed herein includes an apparatus comprising a plurality of NAND strings of memory cells organized into an array. Each NAND string has a first set of memory cells between a first end of the NAND string and a second set of memory cells. The apparatus further includes a control circuit configured to apply a pre-charge voltage to the first end of an unselected NAND string during a pre-charge phase of a programming operation of a memory cell on a selected NAND string. The control circuit is further configured to apply an overdrive voltage to programmed memory cells of the first set while applying a bypass voltage to an unprogrammed memory cell of the second set and while applying the pre-charge voltage to the first end such that the pre-charge voltage charges a channel coupled to an unselected memory cell on the unselected NAND string. The unprogrammed memory cell is positioned between the first set of memory cells and the unselected memory cell. The control circuit is further configured to raise voltage at the unselected memory cell from the pre-charge voltage to an inhibit voltage during a program phase of the programming operation which applies a program voltage to the unselected memory cell.

In a second embodiment disclosed herein includes, and in furtherance of the first embodiment, the apparatus further comprises a bit line connected to the first end of the unselected NAND string. The control circuit is configured to apply the pre-charge voltage to bit line.

In a third embodiment disclosed herein includes, and in furtherance of the first embodiment, the apparatus further comprises a source line connected to the first end of the unselected NAND string. The control circuit is configured to apply the pre-charge voltage to source line.

In a fourth embodiment disclosed herein includes, and in furtherance of any of the first to third embodiments, the control circuit is further configured to apply the overdrive voltage to all programmed memory cells in a third set of memory cells between the second set of memory cells and a second end of the unselected NAND string while applying a pre-charge voltage to the second end of the unselected NAND string.

In a fifth embodiment disclosed herein includes, and in furtherance of the third embodiment, the unselected NAND string further comprises a first non-data transistor between the first set of memory cells and the second set of memory cells. The unselected NAND string further comprises a second non-data transistor between the second set of memory cells and the third set of memory cells.

In a sixth embodiment disclosed herein includes, and in furtherance of any of the first to fifth embodiments, the control circuit is further configured to apply the bypass voltage to unprogrammed memory cells in the first set of memory cells while applying the pre-charge voltage to the first end of the unselected NAND string.

In a seventh embodiment disclosed herein includes, and in furtherance of any of the first to sixth embodiments, the control circuit is further configured to apply the bypass voltage to all programmed memory cells in the first set of memory cells while initially applying the pre-charge voltage to the first end of the unselected NAND string. The control circuit is further configured to increase the voltage to the programmed memory cells in the first set of memory cells from the bypass voltage to the overdrive voltage after the pre-charge voltage has stabilized on the first end of the unselected NAND string.

One embodiment includes a method comprising pre-charging a channel of an unselected NAND string and inhibiting programming of an unselected memory cell on the unselected NAND string. Pre-charging the channel of the unselected NAND string comprises: increasing a voltage at a first end of the unselected NAND string to a pre-charge voltage; increasing the voltage on programmed word lines in a first vertical sub-block between a first end of the unselected NAND string and a second vertical sub-block to an overdrive voltage after the voltage on the first end stabilizes at the pre-charge voltage; and applying a bypass voltage to unprogrammed word lines in the second vertical sub-block while the first end is at the pre-charge voltage, the unprogrammed word lines between the programmed word lines and a selected word line in the second vertical sub-block. Inhibiting programming of an unselected memory cell on the unselected NAND string comprises: boosting the voltage of the channel of the unselected NAND string after pre-charging the channel; and maintaining the channel of the unselected NAND string at a boosted voltage while applying a program voltage to the selected word line.

One embodiment includes a non-volatile storage device comprising: a plurality of NAND strings of memory cells, a plurality of word lines connected to the memory cells, and a control circuit. Each NAND string has a first set of data memory cells, a second set of data memory cells, a third set of data memory cells, a first non-data transistor between the first set and the second set of data memory cells, and a second non-data transistor between the second set and the third set of data memory cells. The word lines comprise a first set of data word lines connected to the first set of data memory cells, and a second set of data word lines connected to the second set of data memory cells. The control circuit is configured to apply an overdrive voltage to all programmed data word lines in the first set while applying a bypass voltage to the second set of data word lines and while applying a pre-charge voltage to a first end of an unselected NAND string to pre-charge a channel of an unselected memory cell on the unselected NAND string connected to a selected word line. The selected word line is in the second set of data word lines. The control circuit is further configured to boost a voltage of the channel of the unselected memory cell after pre-charging the channel. The control circuit is further configured to apply a program voltage to the selected word line while the channel voltage of the unselected memory cell is boosted.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of NAND strings of memory cells organized into an array, each NAND string having a first set of memory cells and a second set of memory cells, the first set between a first end of the NAND string and the second set; and
a control circuit configured to:
apply a pre-charge voltage to the first end of an unselected NAND string during a pre-charge phase of a programming operation of a selected memory cell on a selected NAND string;
apply an overdrive voltage to control gates of programmed memory cells of the first set while applying a bypass voltage to a control gate of an unprogrammed memory cell of the second set and while applying the pre-charge voltage to the first end such that the pre-charge voltage charges a channel coupled to an unselected memory cell on the unselected NAND string to the pre-charge voltage, the unprogrammed memory cell positioned between the first set of memory cells and the unselected memory cell; and
raise the voltage at the channel of the unselected memory cell from the pre-charge voltage to an inhibit voltage during a program phase of the programming operation which applies a program voltage to a control gate of the unselected memory cell and to a control gate of the selected memory cell.

2. The apparatus of claim 1, wherein:
the apparatus further comprises a bit line connected to the first end of the unselected NAND string; and
the control circuit is configured to apply the pre-charge voltage to the bit line.

3. The apparatus of claim 1, wherein:
the apparatus further comprises a source line connected to the first end of the unselected NAND string; and
the control circuit is configured to apply the pre-charge voltage to the source line.

4. The apparatus of claim 1, wherein the control circuit is further configured to:
apply the overdrive voltage to control gates of all programmed memory cells in a third set of memory cells between the second set of memory cells and a second end of the unselected NAND string while applying a pre-charge voltage to the second end of the unselected NAND string.

5. The apparatus of claim 4, wherein the unselected NAND string further comprises:
a first non-data transistor between the first set of memory cells and the second set of memory cells; and
a second non-data transistor between the second set of memory cells and the third set of memory cells.

6. The apparatus of claim 1, wherein:
the control circuit is further configured to apply the bypass voltage to control gates of unprogrammed memory cells in the first set of memory cells while applying the pre-charge voltage to the first end of the unselected NAND string.

7. The apparatus of claim 1, wherein the control circuit is further configured to:
apply the bypass voltage to the control gates of the programmed memory cells in the first set of memory cells while initially applying the pre-charge voltage to the first end of the unselected NAND string; and
increase the voltage to the control gates of the programmed memory cells in the first set of memory cells from the bypass voltage to the overdrive voltage after the pre-charge voltage has stabilized on the first end of the unselected NAND string.

8. A method comprising:
pre-charging a channel of an unselected NAND string that resides in a first vertical sub-block and a second vertical sub-block to a pre-charge voltage comprising:
increasing a voltage at a first end of the unselected NAND string to the pre-charge voltage;
increasing the voltage on programmed word lines in the first vertical sub-block between the first end of the unselected NAND string and the second vertical sub-block to an overdrive voltage after the voltage on the first end stabilizes at the pre-charge voltage; and
applying a bypass voltage to unprogrammed word lines in the second vertical sub-block while the first end is at the pre-charge voltage, the unprogrammed word lines between the programmed word lines and a selected word line in the second vertical sub-block; and inhibiting programming of an unselected memory cell on the unselected NAND string comprising:
boosting the voltage of the channel of the unselected NAND string after pre-charging the channel to the pre-charge voltage; and
maintaining the channel of the unselected NAND string at a boosted voltage while applying a program voltage to the selected word line, wherein the unselected memory cell is connected to the selected word line.

9. The method of claim 8, wherein applying the pre-charge voltage to the first end of the unselected NAND string comprises:
applying the pre-charge voltage to a bit line connected to a select transistor on the unselected NAND string.

10. The method of claim 8, wherein applying the pre-charge voltage to the first end of the unselected NAND string comprises:
applying the pre-charge voltage to a source line connected to a select transistor on the unselected NAND string.

11. The method of claim 8, further comprising:
turning on non-data transistors connected to a non-data word line between the first vertical sub-block and the second vertical sub-block while applying the pre-charge voltage to the first end of the unselected NAND string to allow the pre-charge voltage to pass to channels of memory cells of the unselected NAND in the second vertical sub-block.

12. The method of claim 8, further comprising:
applying the bypass voltage on the programmed word lines in the first vertical sub-block while increasing the voltage at the first end of the unselected NAND string to the pre-charge voltage.

13. The method of claim 8, further comprising:
applying the pre-charge voltage to a second end of the unselected NAND string; and
applying the overdrive voltage to all programmed word lines in a third vertical sub-block between the second end of the unselected NAND string and the second vertical sub-block after the pre-charge voltage on the second end of the unselected NAND string has stabilized to pass the pre-charge voltage from the second end to the channel of the unselected NAND string.

14. The method of claim 8, further comprising:
applying the bypass voltage to unprogrammed word lines in the first vertical sub-block while applying the pre-charge voltage to the first end of the unselected NAND string.

15. A non-volatile storage device comprising:
a plurality of NAND strings of memory cells, each NAND string having a first set of data memory cells, a second set of data memory cells, a third set of data memory cells, a first non-data transistor between the first set of data memory cells and the second set of data memory cells, and a second non-data transistor between the second set of data memory cells and the third set of data memory cells;
a plurality of word lines connected to the plurality of NAND strings of memory cells, the word lines comprising a first set of data word lines connected to the first set of data memory cells, and a second set of data word lines connected to the second set of data memory cells; and
a control circuit configured to:
apply an overdrive voltage to all programmed data word lines in the first set of data word lines while applying a bypass voltage to the second set of data word lines and while applying a pre-charge voltage to a first end of an unselected NAND string to pre-charge a channel of an unselected memory cell on the unselected NAND string to the pre-charge voltage, wherein the unselected memory cell is connected to a selected word line, wherein the selected word line is in the second set of data word lines;
boost a voltage of the channel of the unselected memory cell to an inhibit voltage after pre-charging the channel to the pre-charge voltage; and
apply a program voltage to the selected word line while the channel voltage of the unselected memory cell is boosted to the inhibit voltage.

16. The non-volatile storage device of claim 15, wherein the control circuit is further configured to:
turn on the first non-data transistor of the unselected NAND string while applying the pre-charge voltage to the first end of the unselected NAND string.

17. The non-volatile storage device of claim 15, wherein:
the non-volatile storage device further comprises a bit line connected to the first end of the unselected NAND string; and
the control circuit is configured to apply the pre-charge voltage to bit line.

18. The non-volatile storage device of claim 15, wherein:
the non-volatile storage device further comprises a source line connected to the first end of the unselected NAND string; and
the control circuit is configured to apply the pre-charge voltage to the source line.

19. The non-volatile storage device of claim 15, wherein the control circuit is further configured to:
apply the bypass voltage to the data word lines in the first set having programmed memory cells while initially applying the pre-charge voltage to the first end of the unselected NAND string; and
increase the voltage on the data word lines in the first set of data word lines having programmed memory cells from the bypass voltage to the overdrive voltage after the pre-charge voltage to the first end of the unselected NAND string has stabilized.

20. The non-volatile storage device of claim 15, wherein:
each NAND string further comprises a fourth set of data memory cells and a third non-data transistor, the third non-data transistor between the third set of data memory cells and the fourth set of data memory cells;
the plurality of word lines further comprise a third set of data word lines connected to the third set of data memory cells; and
the control circuit is further configured to:
apply the overdrive voltage to all programmed data word lines in the first set of data word lines and the second set of data word lines while applying the bypass voltage to the third set of data word lines and while applying the pre-charge voltage to the first end of the unselected NAND string to pre-charge a channel of an unselected memory cell on the unselected NAND string to the pre-charge voltage, wherein the unselected memory cell is connected to a selected word line in the third set of data word lines; and apply a program voltage to the selected word line in the third set of data word lines after pre-charging the channel of the unselected memory cell.

* * * * *